United States Patent
Kim et al.

(10) Patent No.: US 10,748,968 B2
(45) Date of Patent: Aug. 18, 2020

(54) IMAGE SENSOR HAVING AN ETCH STOP LAYER ON THE INSULATION LAYER

(71) Applicant: Samsung Electronics Co., Ltd., Suwon-si, Gyeonggi-do (KR)

(72) Inventors: Dong Chan Kim, Suwon-si (KR); Kwan Sik Kim, Seoul (KR); Bo Yun Kim, Hwaseong-si (KR); Eun Sung Seo, Hwaseong-si (KR); Il Young Yoon, Hwaseong-si (KR); Seung Hoon Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/285,510

(22) Filed: Feb. 26, 2019

(65) Prior Publication Data
US 2019/0371861 A1 Dec. 5, 2019

(30) Foreign Application Priority Data
Jun. 5, 2018 (KR) .................. 10-2018-0064721

(51) Int. Cl.
*H01L 27/146* (2006.01)
*H01L 27/30* (2006.01)
*H01L 51/44* (2006.01)
*H01L 31/0232* (2014.01)
*H01L 31/0224* (2006.01)

(52) U.S. Cl.
CPC ...... *H01L 27/307* (2013.01); *H01L 27/14621* (2013.01); *H01L 31/0232* (2013.01); *H01L 31/022475* (2013.01); *H01L 51/442* (2013.01)

(58) Field of Classification Search
CPC ............. H01L 27/146; H01L 27/14605; H01L 27/14638; H01L 27/14643; H01L 27/14665; H01L 27/307
See application file for complete search history.

(56) References Cited

U.S. PATENT DOCUMENTS

| | | | |
|---|---|---|---|
| 7,084,503 B2 | 8/2006 | Ishikawa et al. | |
| 8,247,262 B2 | 8/2012 | Huang et al. | |
| 8,617,986 B2 | 12/2013 | Liang | |
| 8,704,281 B2 | 4/2014 | Maehara et al. | |
| 9,299,573 B2 | 3/2016 | Mishima et al. | |
| 10,531,020 B2 * | 1/2020 | Murata | ............ H01L 27/14643 |
| 2013/0020663 A1 | 1/2013 | Takimoto | |
| 2017/0170238 A1 | 6/2017 | Lee et al. | |

* cited by examiner

*Primary Examiner* — Hoai V Pham
(74) *Attorney, Agent, or Firm* — Harness, Dickey and Pierce, P.L.C.

(57) ABSTRACT

An image sensor includes a sensor region for receiving light and generating an image data and a pad region adjacent to the sensor region, an insulation layer on the substrate, and a lower transparent electrode on the insulation layer in the sensor region, and an etch stop layer on the insulation layer in the sensor region and pad region. The etch stop layer may include silicon nitride. A height of an uppermost surface of the lower transparent electrode may be substantially equal to a height of an upper surface of the etch stop layer, with respect to the substrate.

20 Claims, 20 Drawing Sheets

US 10,748,968 B2

IMAGE SENSOR HAVING AN ETCH STOP LAYER ON THE INSULATION LAYER

CROSS-REFERENCE TO RELATED APPLICATION

This application claims priority under 35 U.S.C. § 119 to Korean Patent Application No. 10-2018-0064721, filed on Jun. 5, 2018, in the Korean Intellectual Property Office, the disclosure of which is hereby incorporated by reference in its entirety.

TECHNICAL FIELD

Example embodiments of the present disclosure relate to an image sensor and/or a method of manufacturing the same. For example, at least some example embodiments relate to an image sensor including a transparent electrode and/or a method of manufacturing the same

DISCUSSION OF RELATED ART

An image sensor is a device for converting an optical image into an electrical signal. With development of the computer industry and the telecommunication industry, the demand for image sensors with improved performance are increased in various fields, such as a digital camera, a camcorder, a personal communication system (PCS), a game device, a security camera, a medical micro camera. An image sensor may be classified into a charge coupled device (CCD) and a complementary metal oxide semiconductor (CMOS) image sensor. The CMOS image sensor can be easily driven and include a signal processing circuit integrated therein thereby reducing the size of the image sensor. The CMOS image sensor is also very low in power consumption, so it can be easily applied to devices with limited battery capacity. In addition, the CMOS image sensor can be fabricated by a CMOS process technology, thereby reducing manufacturing costs. Therefore, as a high resolution can be implemented, the use of CMOS image sensor is rapidly increased.

SUMMARY

According to example embodiments of the inventive concepts, an image sensor may include a substrate including a sensor region and a pad region adjacent to the sensor region; an insulation layer on the substrate; a lower transparent electrode on the insulation layer within the sensor region; and an etch stop layer on the insulation layer within both the sensor region and the pad region, wherein a height of an uppermost portion of an upper surface of the lower transparent electrode with respect to the substrate is substantially equal to a height of an upper surface of the etch stop layer with respect to the substrate.

According to example embodiments of the inventive concepts, an image sensor may include a substrate including a sensor region and a pad region, the sensor region including a first pixel region a second pixel region; an insulation layer on the substrate; a first lower transparent electrode on the insulation layer within the first pixel region; a second lower transparent electrode on the insulation layer within the second pixel region; and a first etch stop layer on the insulation layer in the sensor region and the pad region such that, in the sensor region, the first etch stop layer is on the insulation layer between the first lower transparent electrode and the second lower transparent electrode, wherein an uppermost portion of an upper surface of the first lower transparent electrode with respect to the substrate is substantially coplanar with an upper surface of the first etch stop layer with respect to the substrate.

According to example embodiments of the inventive concepts, an image sensor may include a substrate including a sensor region and a pad region adjacent to the sensor region; a first photoelectric conversion layer in a portion of the substrate associated with the sensor region; an interlayer insulation structure on the substrate, the interlayer insulation structure including an insulation layer and an etch stop layer on the insulation layer; a trench in a portion of the interlayer insulation structure associated with the sensor region; a lower transparent electrode in the trench; and a second photoelectric conversion layer on the lower transparent electrode.

DETAILED DESCRIPTION

Figure 1:
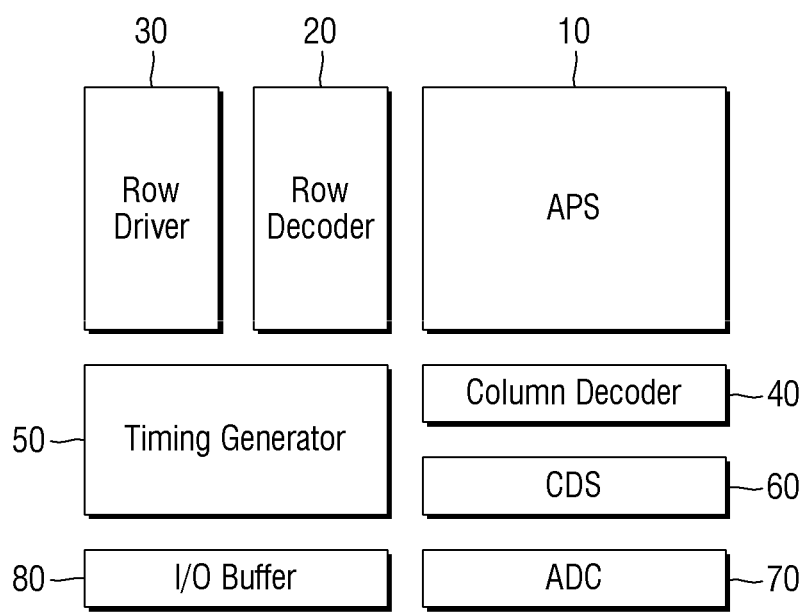
FIG. 1 is a block diagram of an image sensor according to example embodiments.

Various example embodiments will now be described more fully hereinafter with reference to the accompanying drawings. Like reference numerals may refer to like elements throughout this application.

Figure 2:
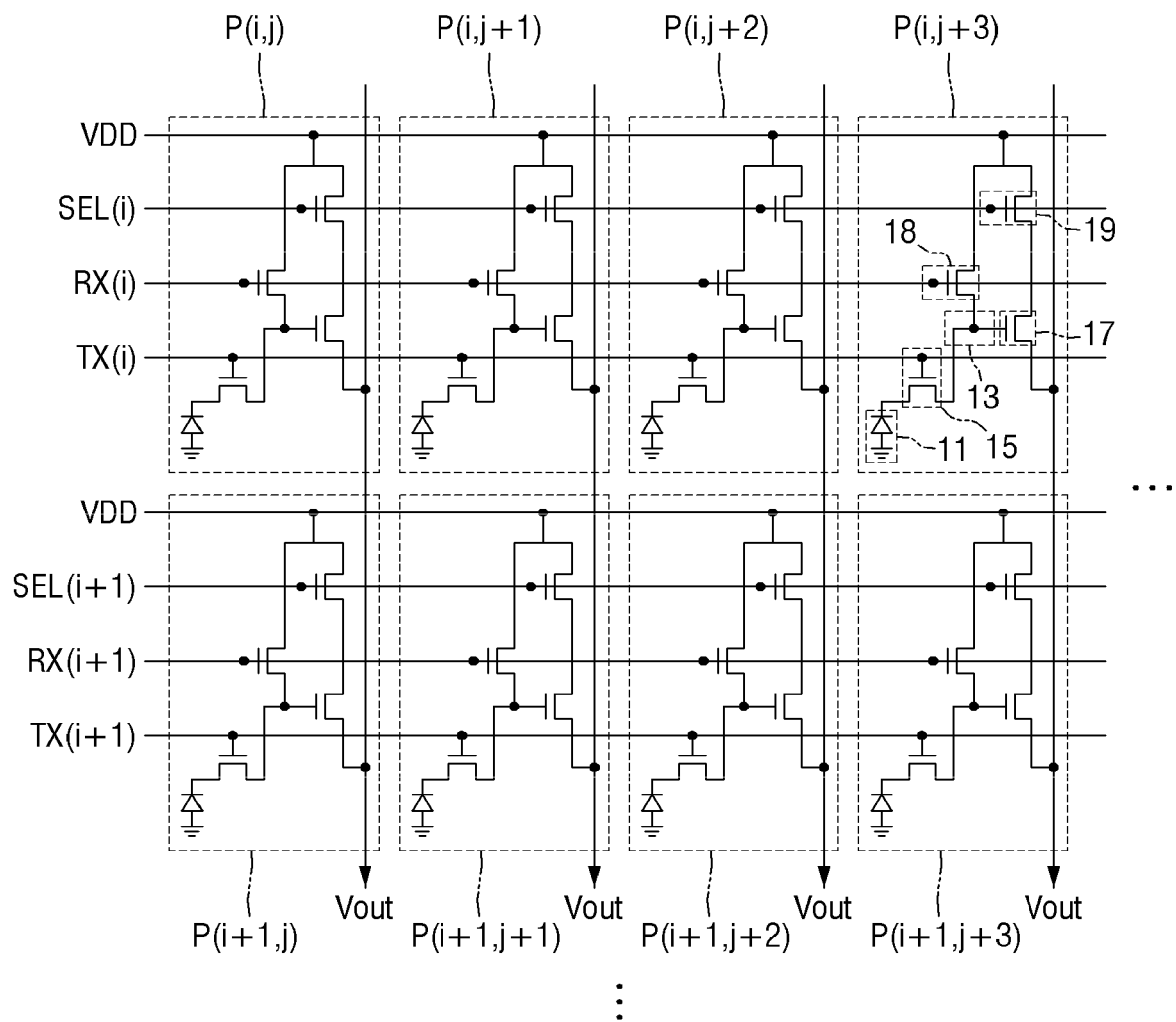
FIG. 2 is an equivalent circuit of a sensor array of FIG. 1.
Figure 3:
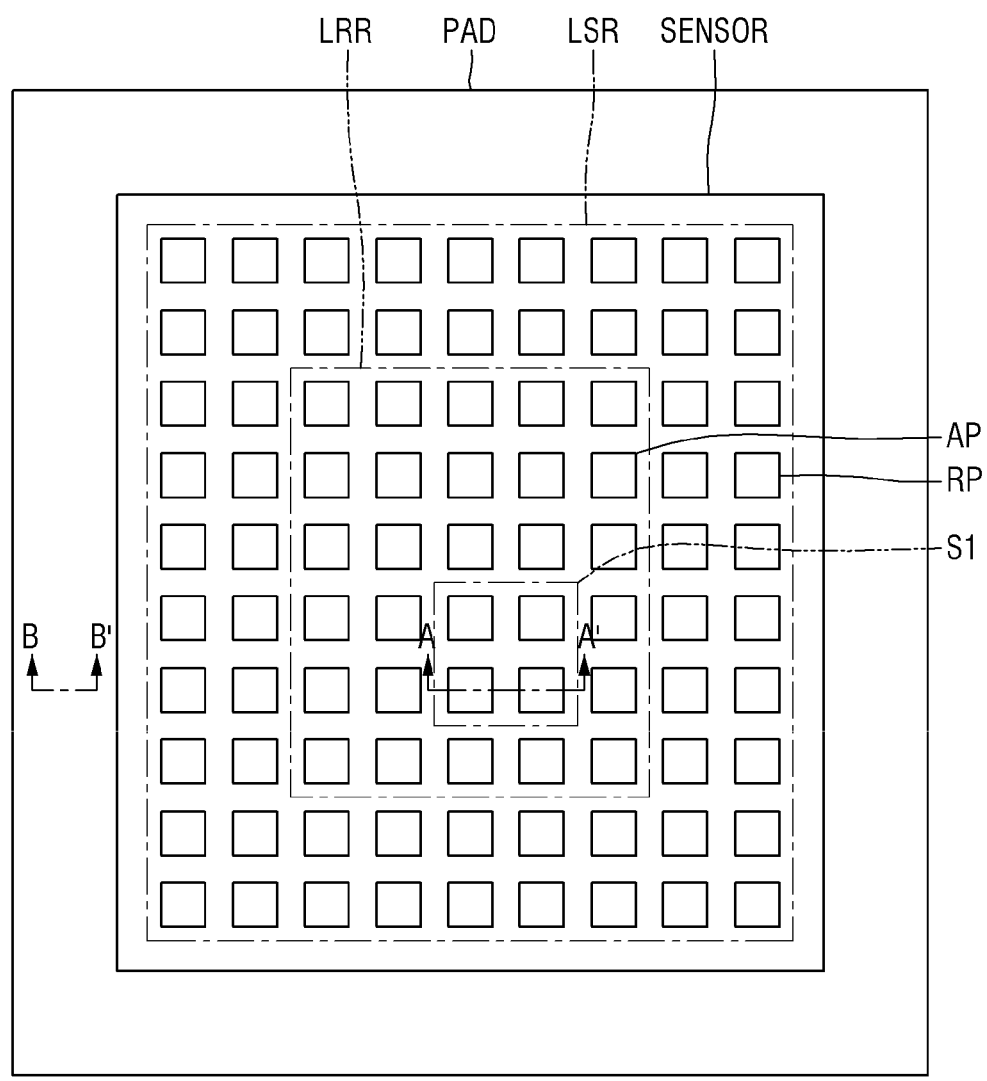
FIG. 3 is a schematic planar view of an image sensor according to example embodiments.
Figure 4:
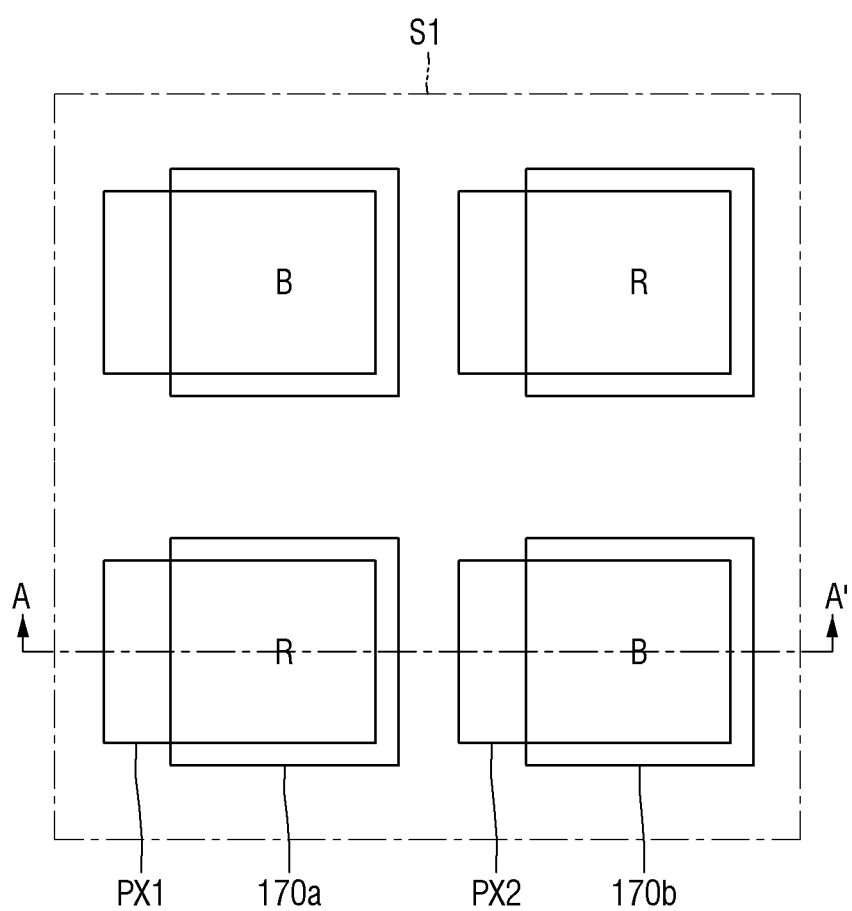
FIG. 4 is a layout diagram illustrating first region S1 of FIG. 3.
Figure 5:
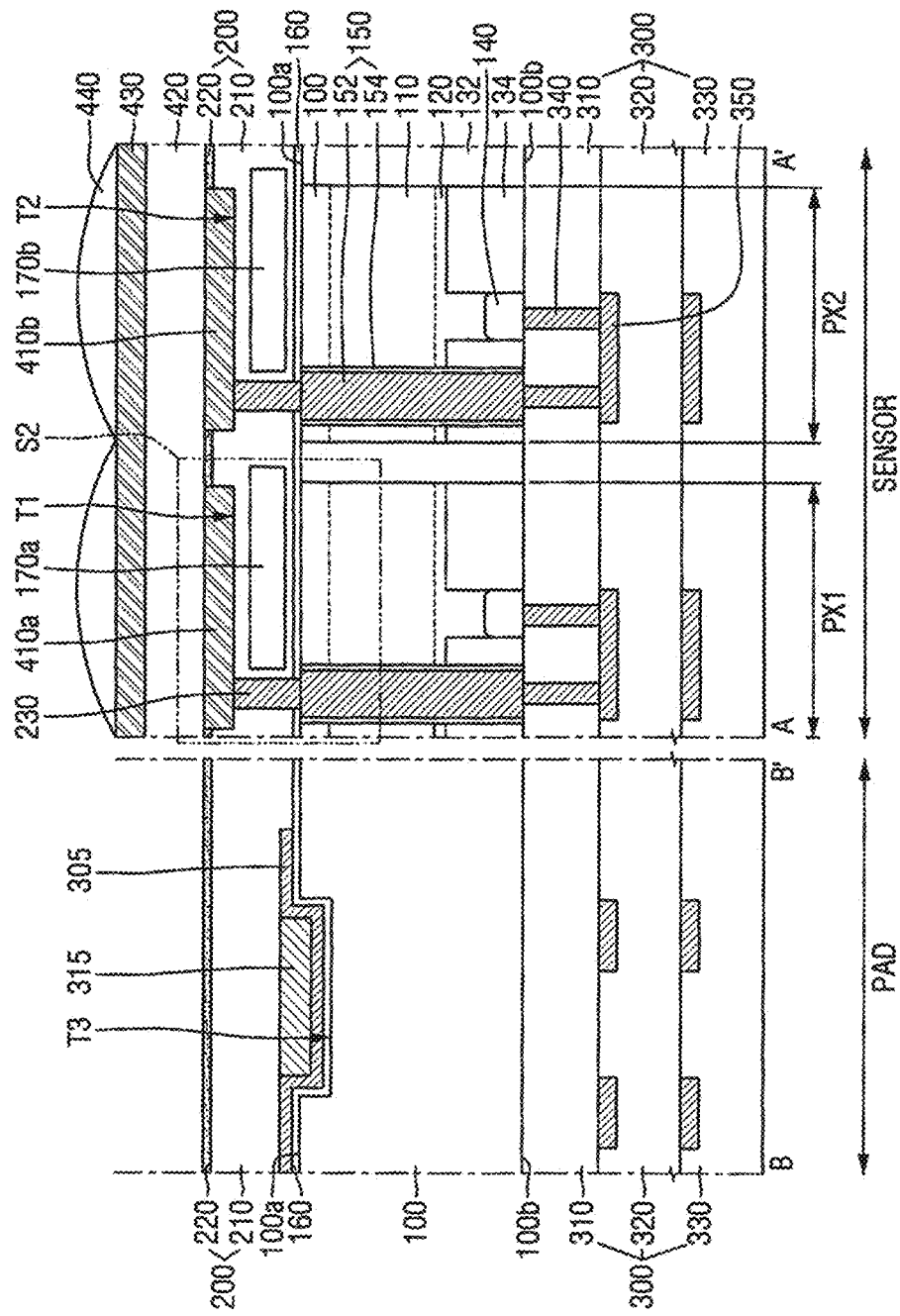
FIG. 5 is a cross-sectional view taken along line A-A' and B-B' of FIG. 3.
Figure 6:
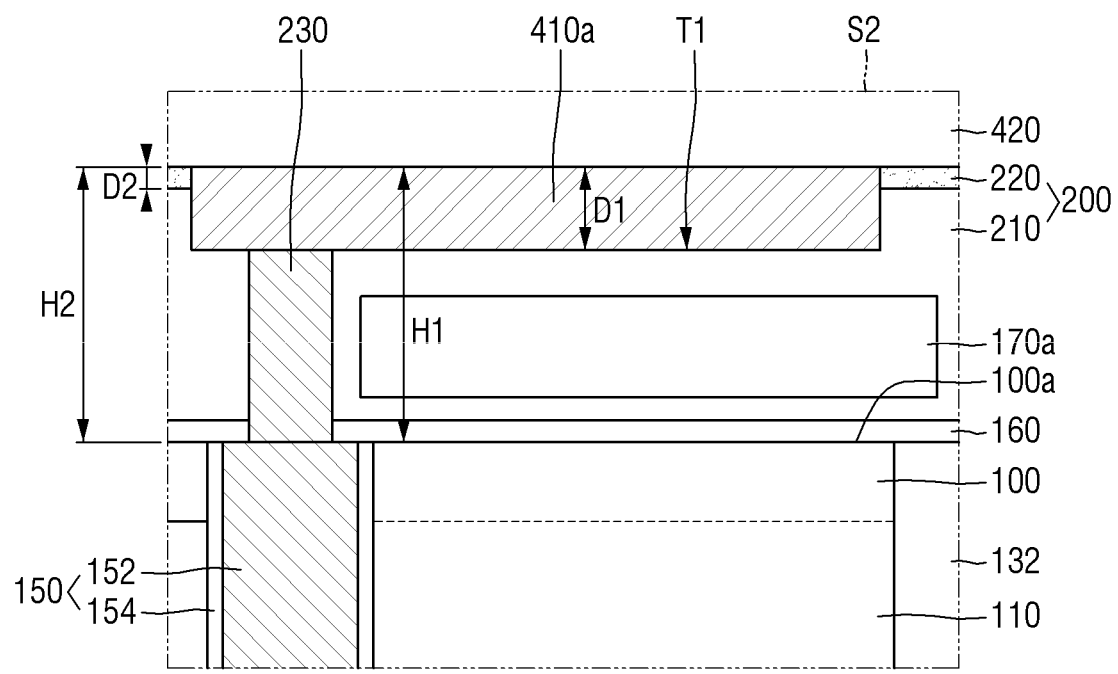
FIGS. 6 and 7 are enlarged views of second region S2 of FIG. 5.
Figure 7:
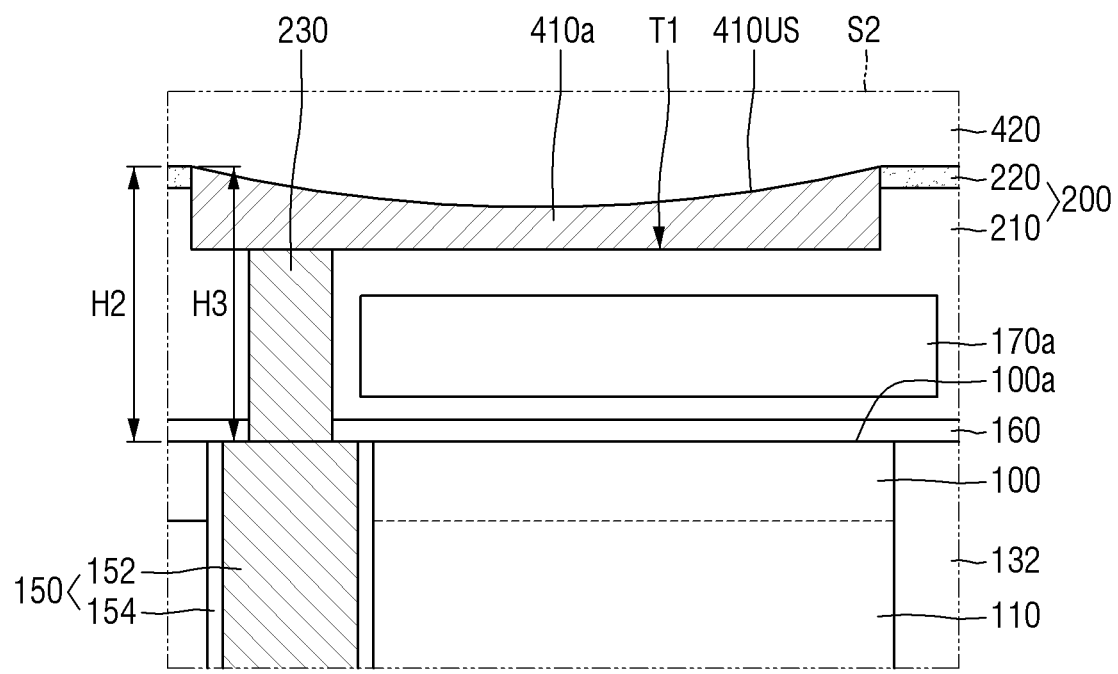

FIG. 1 is a block diagram of an image sensor according to example embodiments. FIG. 2 is an equivalent circuit of a sensor array of FIG. 1. FIG. 3 is a schematic planar view of an image sensor according to example embodiments. FIG. 4 is a layout diagram illustrating first region S1 of FIG. 3. FIG. 5 is a cross-sectional view taken along line A-A' and B-B' of FIG. 3. FIGS. 6 and 7 are enlarged views of second region S2 of FIG. 5.

Referring to FIG. 1, an image sensor according to example embodiments may include an active pixel sensor array 10, a row decoder 20, a row driver 30, a column decoder 40, a timing generator 50, a correlated double sampler (CDS) 60, an analog to digital converter (ADC) 70, and an input/output buffer 80.

The active pixel sensor array 10 may include a plurality of unit pixels arranged in two dimensions and may convert an optical signal into an electrical signal. The active pixel sensor array 10 may be driven by a plurality of driving signals, such as a selection signal, a reset signal, and a transfer signal from the row driver 30. The electrical signal converted by the active pixel sensor array 10 may be provided to the correlated double sampler 60.

The row driver 30 may provide a plurality of driving signals for driving a plurality of unit pixels to the active pixel sensor array 10 in accordance with a result decoded in the row decoder 20. In the case in which the unit pixels are arranged in rows and columns, the driving signals may be provided to each row.

The timing generator 50 may provide a timing signal and a control signal to the row decoder 20 and the column decoder 40.

The correlated double sampler 60 may receive an electrical signal generated from the active pixel sensor array 10 and may hold and sample it. The correlated double sampler 60 may double-sample a reference level including a certain noise and a signal level by the electrical signal and may output a difference level corresponding to a difference between the reference level and the signal level.

The analog to digital converter 70 may convert an analog signal corresponding to the difference level output from the correlated double sampler 60 into a digital signal and may output the digital signal.

The input/output buffer 80 may latch the digital signal, and the latched signal may sequentially output the digital signal to a video signal processing unit in accordance with a result decoded in the column decoder 40.

Referring to FIG. 2, unit pixels P may be arranged in rows and columns to constitute the active pixel array (see, e.g., 10 of FIG. 1). Each unit pixel P may include a photoelectric transistor 11, a floating diffusion region (FD) 13, a charge transfer transistor 15, a drive transistor 17, a reset transistor 18, and a selection transistor 19. Their functions will be described with reference to i row pixels (P(i, j), P(i, j+1), P(i, j+2), P(i, j+3), . . . , as an example.

The photoelectric transistor 11 may receive the incident light to accumulate charges corresponding to the quantity of light. The photoelectric transistor 11 may include, e.g., a photo diode, a photo transistor, a photo gate, a pinned photo diode (PPD), an organic photo diode (OPD), a quantum dot (QD), or combinations thereof.

The photoelectric transistor 11 may be coupled to the charge transfer transistor 15 transmitting the accumulated charges to the floating diffusion region 13. The floating diffusion region 13 may convert the charges into voltages and may have a parasitic capacitance, thus storing the charges cumulatively.

In the figure, it is illustrated that one charge transfer transistor 15 included in the unit pixel P, but the inventive concepts are not limited thereto. For example, a plurality of charge transfer transistors 15 may be included in the unit pixel P.

For example, a plurality of photoelectric transistors 11 may be disposed in the unit pixel P. Thus, the charge transfer transistor 15 corresponding to each of the plurality of photoelectric transistors 11 may be disposed in the unit pixel. In some example embodiments, in the case in which the plurality of charge transfer transistors 15 are disposed in the unit pixel P, the floating diffusion region 13 may be shared.

The drive transistor 17 may be, e.g., a source follower amplifier. Thus, the drive transistor 17 may amplify the variation of electrical potential of the floating diffusion region 13 that has received the accumulated charges from the photoelectric transistor 11 and may output the amplified result to an output line Vout.

The reset transistor 18 may periodically reset the floating diffusion region 13. The reset transistor 18 may be constituted by a MOS transistor driven by a reset line (RX(i)) applying a predetermined bias (i.e., a reset signal). When the reset transistor 18 is turned on by a bias supplied by the reset line (RX(i)), a desired (or, alternatively, a predetermined) electrical potential, e.g., a power supply voltage (VDD) provided to a drain of the reset transistor 18 may be transmitted to the floating diffusion region 13.

The selection transistor 19 may serve to select the unit pixel P to be read in a row unit. The selection transistor 19 may be constituted by a MOS transistor driven by a row selection line (SEL(i)) applying a desired (or, alternatively, a predetermined) bias (i.e., a row selection signal). When the selection transistor 19 is turned on by a bias supplied by the row selection line (SEL(i)), a desired (or, alternatively, a predetermined) electrical potential, e.g., a power supply voltage (VDD) provided to a drain of the selection transistor 19 may be transmitted to a drain region of the drive transistor 17.

A transfer line (TX(i)) applying a bias to the charge transfer transistor 15, the reset line (RX(i)) applying the bias to the reset transistor 18, the row selection line (SEL(i)) applying the bias to the selection transistor 19 may be arranged to extend substantially parallel to each other in a row direction.

Referring to FIGS. 3 and 4, the image sensor according to example embodiments may include a sensor region SENSOR and a pad region PAD.

The sensor region SENSOR, in which the unit pixels (see, e.g., P of FIG. 2) are arranged, may include a light-receiving region LRR receiving light to generate an image data and a light-shielding region LSR not receiving light. The light-shielding region LSR may be disposed between the light-receiving region LRR and the pad region PAD. However, the inventive concepts are not limited thereto. For example, the light-receiving region LRR and the light-shielding region LSR may be arranged in various forms.

In the sensor region SENSOR, electrical signals generated by the incident light may be output. In the sensor region SENSOR, a plurality of unit pixel regions PX may be arranged in a matrix form, for example.

The unit pixel region PX may include an active pixel region AP and a reference pixel region RP. The light-receiving region LRR may be disposed in the active pixel region AP to convert the incident light into the electrical signals. The reference pixel region RP may be disposed in the light-shielding region LSR to output an electrical signal generated from a region on which light is not incident.

The unit pixel region PX may include a first pixel region PX1 and a second pixel region PX2 that are adjacent to each other. In the figure, it is illustrated that the first pixel region PX1 and the second pixel region PX2 are the active pixel regions AP, but the inventive concepts are not limited thereto. For example, one of the first pixel region PX1 and the second pixel region PX2 may be the reference pixel region RP, or all of the first pixel region PX1 and the second pixel region PX2 may be the reference pixel regions RP.

In some example embodiments, the first pixel region PX1 may sense red light, and the second pixel region PX2 may sense blue light. For example, a first color filter 170a that is a red color filter R may be disposed in the first pixel region PX1, and a second color filter 170b that is a blue color filter B may be disposed in the second pixel region PX2. In some example embodiments, referring to FIG. 4, the red color filter R and the blue color filter B may be alternately arranged.

The pad region PAD may include a conductive pad (see, e.g., 315 of FIG. 5) used to input and output a control signal and a photoelectric signal in and from the sensor region SENSOR.

The pad region PAD may be disposed around the light-receiving region LRR to be easily electrically connected to external devices. For example, the pad region PAD may disposed along a perimeter of the sensor region SENSOR. However, the inventive concepts are not limited thereto. For example, the sensor region SENSOR and the pad region PAD may be arranged in various forms.

Referring to FIGS. 3 to 7, the image sensor according to example embodiments may include a substrate 100, a first photoelectric conversion layer 110, a well impurity layer 120, a first device isolation layer 132, a second device isolation layer 134, a storage node region 140, an antireflection layer 160, a first interlayer insulation structure 200, the first color filter 170a, the second color filter 170b, a first lower transparent electrode 410a, a second lower transparent electrode 410b, a second photoelectric conversion layer 420, an upper transparent electrode 430, a microlens 440, the conductive pad 315, and a second interlayer insulation structure 300.

The substrate 100 may include a first surface 100a and a second surface 100b that are opposite to each other. Hereinafter, it will be described that the light is incident on the first surface 100a of the substrate 100.

The substrate 100 may be a structure in which a base substrate and an epitaxial layer are stacked. The substrate 100 may be a silicon substrate, a gallium arsenide substrate, a silicon germanium substrate, a ceramic substrate, a quartz substrate, a display glass substrate, and/or a semiconductor on insulator (SOI) substrate. However, the inventive concepts are not limited thereto.

The first photoelectric conversion layer 110 may be formed in the substrate 100. The first photoelectric conversion layer 110 may generate photo-charges proportional to quantity of light incident from the outside. For example, the first photoelectric conversion layer 110 may receive the light and may convert the light into electrical signals. The first photoelectric conversion layer 110 may include, e.g., a photo diode.

The first photoelectric conversion layer 110 may be formed by doping the substrate 100 with impurities. For example, the first photoelectric conversion layer 110 may be formed by implanting n-type impurities into the substrate 100. In addition, there may be a difference in an impurity concentration between an upper portion of the first photoelectric conversion layer 110 and a lower portion thereof, such that the first photoelectric conversion layer 110 may have a potential gradient. The first photoelectric conversion layer 110 may be formed of a plurality of stacked impurity regions, for example.

For convenience of description, various transistors connected to the first photoelectric conversion layer 110 to process electrical signals are not illustrated in the figure. However, a portion of the substrate 100 may be a region in which various transistors are disposed to process the electrical signals generated from the first photoelectric conversion layer 110. For example, the transfer transistor (see, e.g., 15 of FIG. 2), the reset transistor (see, e.g., 18 of FIG. 2), the drive transistor (see, e.g., 17 of FIG. 2), or the selection transistor (see, e.g., 19 of FIG. 2) may be disposed in portions of the first pixel region PX1 and the second pixel region PX2 to process the electrical signals generated from the first photoelectric conversion layer 110.

The well impurity layer 120 may be formed adjacent to the first photoelectric conversion layer 110. For example, the well impurity layer 120 may be formed in a portion of the substrate 100 adjacent to the second surface 100b thereof. The well impurity layer 120 may be formed by doping the substrate 100 with impurities. For example, the well impurity layer 120 may be formed by doping the substrate 100 with impurities of a conductivity type opposite to that of the first photoelectric conversion layer 110. For example, the well impurity layer 120 may be formed by implanting p-type impurities.

The first device isolation layer 132 may define the unit pixel region PX in the sensor region SENSOR. That is, the first pixel region PX1 and the second pixel region PX2 may be defined by the first device isolation layer 132. The first device isolation layer 132 may extend from the first surface 100a of the substrate 100 to the second surface 100b thereof. The first device isolation layer 132 may surround each of the first pixel region PX1 and the second pixel region PX2. Accordingly, the first pixel region PX1 and the second pixel region PX2 may separate from each other by the first device isolation layer 132.

The first device isolation layer 132 may be formed by patterning the substrate 100 to form a deep trench and then filling the deep trench with an insulating material. Accordingly, the first device isolation layer 132 may extend from the first surface 100a of the substrate 100 to the second surface 100b of the substrate 100. In some example embodiments, according to the patterning process, the first device isolation layer 132 may have a width varying in a direction from the first surface 100a of the substrate 100 to the second surface 100b thereof.

The first device isolation layer 132 may be formed of an insulating material having a lower refractive index than the substrate 100. For example, when the substrate 100 is formed of silicon, the first device isolation layer 132 may be formed of a silicon oxide layer, a silicon nitride layer, an undoped polysilicon layer, air, or combinations thereof.

Accordingly, the first device isolation layer 132 may refract light that is obliquely incident on the first photoelectric conversion layer 110. In addition, the first device isolation layer 132 may prevent photo-charges generated from a specific pixel by the incident light from moving into adjacent pixel region by a random drift. As a result, the first device isolation layer 132 may improve the light receiving efficiency of the first photoelectric conversion layer 110 such that the quality of the image data may be improved.

The second device isolation layer 134 may define an active region in the unit pixel region PX. For example, the second device isolation layer 134 may be formed in a portion of the substrate 100 adjacent to the second surface 100b thereof. In addition, the second device isolation layer 134 may be formed in the well impurity layer 120. Thus, the second device isolation layer 134 may define a portion of the well impurity layer 120, in which the second device isolation layer 134 is not formed, as the active region.

For example, the second device isolation layer 134 may define an active region, such as a storage node region 140, in the well impurity layer 120. The storage node region 140 may be formed by doping with impurities having a conductivity opposite to that of the well impurity layer 120. For example, the storage node region 140 may be formed by implanting n-type impurities. The storage node region 140 may be connected to the second photoelectric conversion layer 420 and may store electrical signals generated from the second photoelectric conversion layer 420.

The second device isolation layer 134 may be formed by patterning the substrate to form a shallow trench and then filling the shallow trench with an insulating material. A depth of the second device isolation layer 134 may be smaller than a depth of the first device isolation layer 132.

The antireflection layer 160 may be formed on the first surface 100a of the substrate 100. In some example embodiments, the antireflection layer 160 may be formed on the substrate 100 of the sensor region SENSOR and the substrate 100 of the pad region PAD. The antireflection layer 160 may reduce (or, alternatively, prevent) reflection of the light that is incident from the first surface 100a of the substrate 100 to the inside of the substrate 100

Referring to FIG. 5, the antireflection layer 160 may be conformally formed along the first surface 100a of the substrate 100, but the inventive concepts is not limited thereto. For example, the antireflection layer 160 may cover lower surfaces and sidewalls of the first color filter 170a and the second color filter 170b. The antireflection layer 160 may be formed of a single layer or multiple layers. In some embodiments, the antireflection layer 160 may be omitted.

The first interlayer insulation structure 200 may be formed on the first surface 100a of the substrate 100. The first interlayer insulation structure 200 may include a first insulation layer 210 and a first etch stop layer 220 that are sequentially stacked on the first surface 100a of the substrate 100.

The first insulation layer 210 may be formed on the substrate 100 of the sensor region SENSOR and the substrate 100 of the pad region PAD. The first insulation layer 210 may be formed to cover an upper surface of the antireflection layer 160.

The first insulation layer 210 may include at least one of silicon oxide, silicon nitride, silicon oxynitride, and a low-k dielectric material having a lower dielectric constant than silicon oxide. The low-k dielectric material may include flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or combinations thereof. Hereinafter, it will be described that the first insulation layer 210 includes low temperature oxide (LTO) that is of a kind of silicon oxide. The LTO means silicon oxide that may be formed at a low temperature of e.g., 100° C.~200° C.

The first etch stop layer 220 may be formed on the first insulation layer 210. The first etch stop layer 220 may be formed on the first insulation layer 210 in the sensor region SENSOR and the pad region PAD.

The first etch stop layer 220 may include a material having an etch selectivity with respect to the first lower transparent electrode 410a and the second lower transparent electrode 410b. For example, the first etch stop layer 220 may include silicon nitride, silicon oxide, silicon carbide, silicon oxynitride, silicon oxycarbide, silicon oxycarbonitride, or combinations thereof. Hereafter, it will be described that the first etch stop layer 220 includes silicon nitride.

The first interlayer insulation structure 200 may include a first trench T1 and a second trench T2 formed in the first interlayer insulation structure 200 in the sensor region SENSOR. For example, the first trench T1 may be formed in the first interlayer insulation structure 200 in the first pixel region PX1, and the second trench T2 may be formed in the first interlayer insulation structure 200 in the second pixel region PX2.

The first trench T1 and the second trench T2 may be formed by etching a portion of the first interlayer insulation structure 200 in the sensor region SENSOR. In some embodiments, a bottom surface of the first trench T and a bottom surface of the second trench T2 may be lower than a lower surface of the first etch stop layer 220, with respect to the first surface 100a of the substrate 100. Thus, a sidewall of the first trench T1 may be defined by an inner sidewall of the first insulation layer 210 and a sidewall of the first etch stop layer 220. The first etch stop layer 220 may not be formed on an upper surface of the first insulation layer 210 defining the first trench T1 and the second trench T2.

The first color filter 170a and the second color filter 170b may be formed on the first surface 100a of the substrate 100. For example, the first color filter 170a may be formed in the first insulation layer 210 in the first pixel region PX1, and the second color filter 170b may be formed in the first insulation layer 210 in the second pixel region PX2.

In some example embodiments, the first color filter 170a and the second color filter 170b may absorb lights of different wavelengths. For example, as described with reference to FIG. 4, the first color filter 170a may be the red color filter R, and the second color filter 170b may be the blue color filter B.

The first lower transparent electrode 410a and the second lower transparent electrode 410b may be formed on the first interlayer insulation structure 200. Thus, the first color filter 170a may be interposed between the substrate 100 and the first lower transparent electrode 410a, and the second color filter 170b may be interposed between the substrate 100 and the second lower transparent electrode 410b.

In addition, the first lower transparent electrode 410a and the second lower transparent electrode 410b may be spaced apart from each other. For example, the first lower transparent electrode 410a may be formed on the first interlayer insulation structure 200 in the first pixel region PX1, and the second lower transparent electrode 410b may be formed on the first interlayer insulation structure 200 in the second pixel region PX2. The first etch stop layer 220 may be interposed between the first lower transparent electrode 410a and the second lower transparent electrode 410b.

The first lower transparent electrode 410a may fill the first trench T1 in the first interlayer insulation structure 200. The second lower transparent electrode 410b may fill the second trench T2 in the first interlayer insulation structure 200. The first etch stop layer 220 may contact a sidewall of the first lower transparent electrode 410a and a sidewall of the second lower transparent electrode 410b. In addition, the first etch stop layer 220 may be formed on the first insulation layer 210 between the first lower transparent electrode 410a and the second lower transparent electrode 410b. An upper surface of the first lower transparent electrode 410a and an upper surface of the second lower transparent electrode 410b may be higher than a lower surface of the first etch stop layer 220, with respect to the first surface 100a of the substrate 100.

A height of the upper surface of the first lower transparent electrode 410a and a height of the upper surface of the second lower transparent electrode 410b may be substantially equal to a height of an upper surface of the first etch stop layer 220, with respect to the first surface 100a of the substrate 100. For example, referring to FIG. 6, a first height H1 from the first surface 100a of the substrate 100 to the upper surface of the first lower transparent electrode 410a may be substantially equal to a second height H2 from the first surface 100a of the substrate 100 to the upper surface of the first etch stop layer 220.

The first lower transparent electrode 410a and the second lower transparent electrode 410b may be formed by a planarization process using the first etch stop layer 220 as a stopper. In this regard, it will be described in detail later with reference to FIGS. 14 to 16.

The first lower transparent electrode 410a and the second lower transparent electrode 410b may include a material having an etch selectivity with respect to the first etch stop layer 220. The first lower transparent electrode 410a and the second lower transparent electrode 410b may include a transparent conductive material. For example, the first lower transparent electrode 410a and the second lower transparent electrode 410b may include indium tin oxide (ITO), zinc oxide (ZnO), tin dioxide ($SnO_2$), antimony-doped tin oxide (ATO), aluminum-doped zinc oxide (AZO), gallium-doped zinc oxide (GZO), titanium dioxide ($TiO_2$), fluorine-doped tin oxide (FTO), or combinations thereof. Hereinafter, it will be described that the first lower transparent electrode 410a and the second lower transparent electrode 410b include ITO.

The first lower transparent electrode 410a and the second lower transparent electrode 410b may be formed at a same process stage. Thus, the first lower transparent electrode 410a and the second lower transparent electrode 410b may include a same material. For example, the first lower transparent electrode 410a and the second lower transparent electrode 410b may include a same ITO.

A composition ratio of elements constituting the first lower transparent electrode 410a and the second lower transparent electrode 410b may be adjusted depending on an etch selectivity of the first lower transparent electrode 410a and the second lower transparent electrode 410b. For example, a composition ratio of indium (In), tin (Sn), and oxygen (O) in the ITO included in the first lower transparent electrode 410a and the second lower transparent electrode 410b may variously adjusted.

In some example embodiments, a thickness of the first lower transparent electrode 410a and a thickness of the second lower transparent electrode 410b may be greater than a thickness of the first etch stop layer 220. For example, referring to FIG. 6, a first thickness D1 of the first lower transparent electrode 410a may be greater than a second thickness D2 of the first etch stop layer 220.

The second thickness D2 of the first etch stop layer 220 may be 30 Å or more. In some example embodiments, the second thickness D2 of the first etch stop layer 220 may range from 200 Å to 600 Å.

In some example embodiments, the upper surfaces of the first and second lower transparent electrodes 410a and 410b may be concave. For example, referring to FIG. 7, the upper surface 410US of the first lower transparent electrode 410a may have an upward concave shape (or a downward convex shape). This may be caused by characteristics of a planarization process for forming the first and second lower transparent electrodes 410a and 410b. For example, the upper surface 410US of the first lower transparent electrode 410a may be concave due to a dishing phenomenon generated during the planarization process.

In some example embodiments, a height of an uppermost surface of the first lower transparent electrode 410a and a height of an uppermost surface of the second lower transparent electrode 410b may be substantially equal to the height of the upper surface of the first etch stop layer 220, with respect to the first surface 100a of the substrate 100. For example, referring to FIG. 7, a third height H3 from the first surface 100a of the substrate 100 to the uppermost point of the upper surface 410US of the first lower transparent electrode 410a adjacent to the first etch stop layer 220 may be substantially equal to the second height H2 from the first surface 100a of the substrate 100 to the upper surface of the first etch stop layer 220.

The second photoelectric conversion layer 420 may be formed on the first lower transparent electrode 410a and the second lower transparent electrode 410b. For example, the second photoelectric conversion layer 420 may extend along the upper surface of the first lower transparent electrode 410a, the upper surface of the second lower transparent electrode 410b, and the upper surface of the first etch stop layer 220 in the sensor region SENSOR.

The second photoelectric conversion layer 420 may generate photo-charges proportional to the quantity of light that is incident from the outside. The second photoelectric conversion layer 420 may receive the light and may convert the light into electric signals.

The second photoelectric conversion layer 420 may correspond to the photoelectric transistor 11 of FIG. 2. For example, the second photoelectric conversion layer 420 may include a photo diode, a photo transistor, a photo gate, a pinned photo diode (PPD), an organic photo diode (OPD), a quantum dot (QD), or combinations thereof. Hereinafter, it will be described that the second photoelectric conversion layer 420 includes an organic photo diode.

The upper transparent electrode 430 may be formed on the second photoelectric conversion layer 420. Thus, the second photoelectric conversion layer 420 may be interposed between the first lower transparent electrode 410a and the upper transparent electrode 430 and between the second lower transparent electrode 410b and the upper transparent electrode 430.

The upper transparent electrode 430 may extend across the first pixel region PX1 and the second pixel region PX2, but the inventive concepts are not limited thereto. For example, the upper transparent electrode 430 may be separately formed in each of the first pixel region PX1 and the second pixel region PX2.

The upper transparent electrode 430 may include a transparent conductive material. For example, the upper transparent electrode 430 may include indium tin oxide (ITO), zinc oxide (ZnO), tin dioxide ($SnO_2$), antimony-doped tin oxide (ATO), aluminum-doped zinc oxide (AZO), gallium-doped zinc oxide (GZO), titanium dioxide ($TiO_2$), fluorine-doped tin oxide (FTO), or combinations thereof. The upper transparent electrode 430 may include the same material as or a different material from the first lower transparent electrode 410a and the second lower transparent electrode 410b.

The microlens 440 may be formed on the upper transparent electrode 430. The microlens 440 may have a convex shape and may have a predetermined radius of curvature. Thus, the microlens 440 may collect the light that is incident on the first pixel region PX1 and the second pixel region PX2.

The microlens 440 may include an organic material, such as light-transmitting resin, but is not limited thereto.

In some example embodiments, the second photoelectric conversion layer 420 may sense green light. For example, light of green wavelength among the incident lights collected by the microlens 440 may be adsorbed in the second photoelectric conversion layer 420. Thus, the second photoelectric conversion layer 420 may provide an electrical signal for the green light. The lights of other wave lengths other than the green light may pass through the second photoelectric conversion layer 420.

In some example embodiments, the first photoelectric conversion layer 110 may sense the red light or the blue light. For example, the light passing through the second photoelectric conversion layer 420 may pass through the first color filter 170a and may provide the red light to the first photoelectric conversion layer 110 in the first pixel region PX1. In addition, for example, the light passing through the second photoelectric conversion layer 420 may pass through the second color filter 170b and may provide the blue light to the first photoelectric conversion layer 110 in the second pixel region PX2. Therefore, the first photoelectric conversion layer 110 in the first pixel region PX1 may provide an electrical signal for the red light, and the first photoelectric conversion layer 110 in the second pixel region PX2 may provide an electrical signal for the blue light.

The conductive pad 315 may be formed on the substrate 100 of the pad region PAD. For example, the conductive pad 315 may be formed on a first wiring line 305 that is formed on the first surface 100a of the substrate 100 of the pad region PAD.

The conductive pad 315 and the first wiring line 305 may include metal e.g., copper (Cu) or aluminum (Al), but are not limited thereto.

In some embodiments, the conductive pad 315 may fill a third trench T3 in the substrate 100 of the pad region PAD. For example, referring to FIG. 5, the first wiring line 305 may conformally extend along a sidewall and a bottom surface of the third trench T3, and the conductive pad 315 may fill the third trench T3. The first wiring line 305 may be disposed on the antireflection layer 160.

The second interlayer insulation structure 300 may be formed on the second surface 100b of the substrate 100. The second interlayer insulation structure 300 may include three insulation layers, e.g., a second insulation layer 310, a third insulation layer 320, and a fourth insulation layer 330 that are sequentially stacked on the second surface 100b of the substrate 100. In some example embodiments, the second interlayer insulation structure 300 may include more than or less than three insulation layers. The second insulation layer 310, the third insulation layer 320, and the fourth insulation layer 330 may include, e.g., silicon oxide, silicon nitride, silicon oxynitride, and a low-k dielectric material having a dielectric constant lower than silicon oxide.

The image sensor according to example embodiments may further include a through via 150. The through via 150 may extend through the substrate 100 to electrically connect a respective one of the first lower transparent electrode 410a and the second lower transparent electrode 410b to the storage node region 140. For example, the through via 150 may be electrically connected to the storage node region 140 through a second contact 340 and a second wiring line 350 in the second interlayer insulation structure 300. Thus, the electrical signal generated from the second photoelectric conversion layer 420 may be stored in the storage node region 140.

In some example embodiments, the through via 150 may include a conductor 152 and a fifth insulation layer 154. The conductor 152 of the through via 152 may pass through the substrate 100 to extend from the first surface 100a of the substrate 100 to the second surface 100b of the substrate 100. The fifth insulation layer 154 of the through via 150 may cover a sidewall of the conductor 152 to insulate the conductor 152 from the substrate 100.

In some example embodiments, the first lower transparent electrode 410a and the second lower transparent electrode 410b may be electrically connected to the storage node region 140 through a contact not passing through the substrate 100. For example, in the case in which the well impurity layer 120 or the storage node region 140 are formed in a portion of the substrate 100 adjacent to the first surface 100a thereof, the first lower transparent electrode 410a and the second lower transparent electrode 410b may be electrically connected to the storage node region 140 through the first contact 230 or the like.

Figure 8:
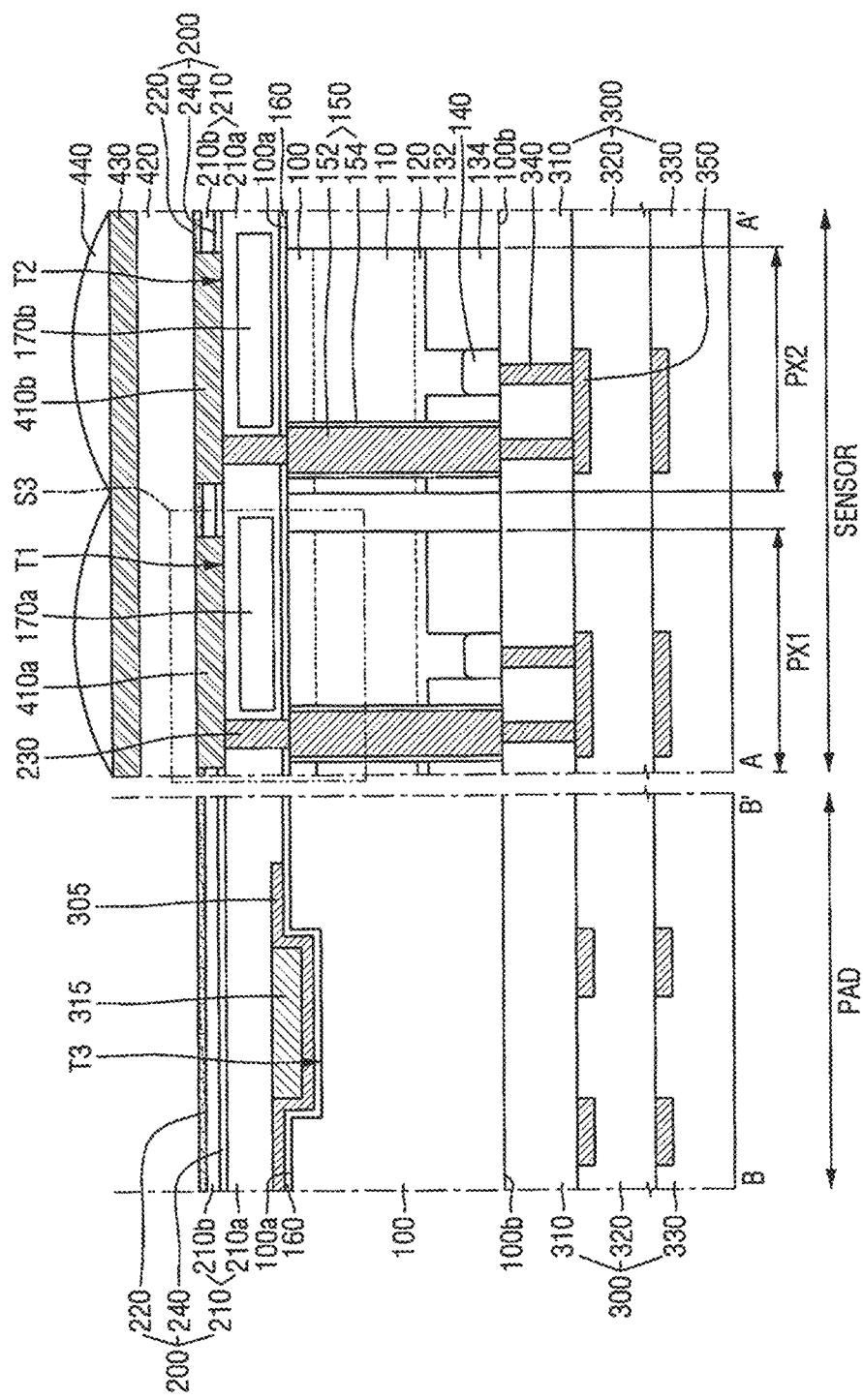
FIG. 8 is a schematic cross-sectional view of an image sensor according to example embodiments.
Figure 9:
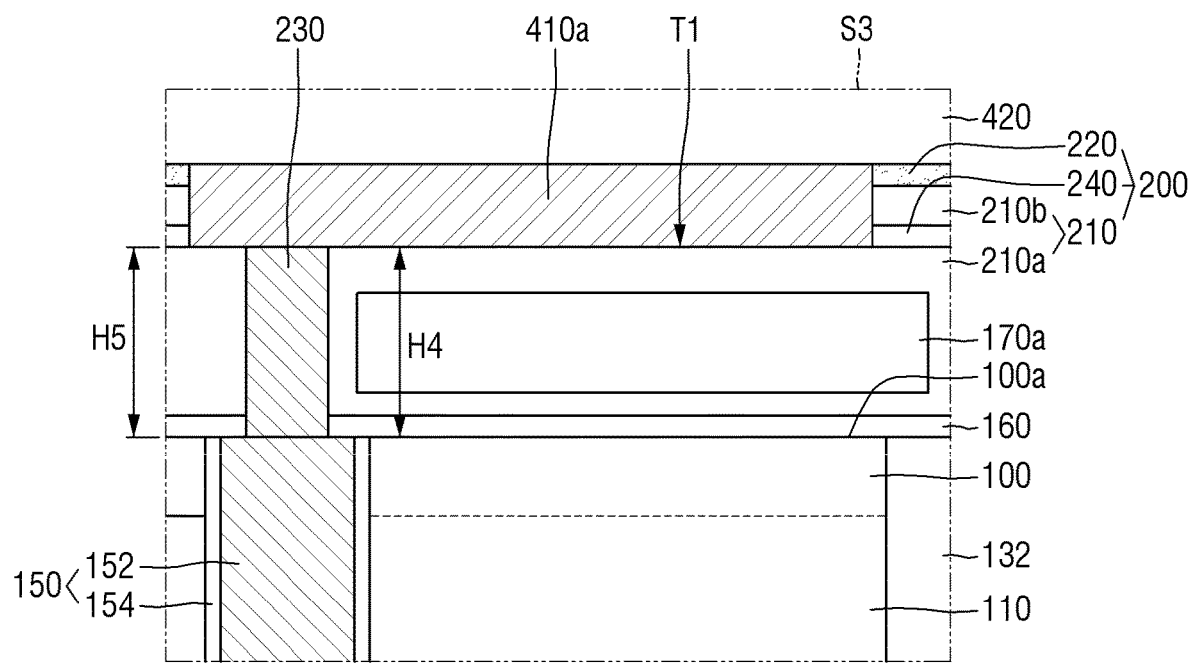
FIG. 9 is an enlarged view of third region S3 of FIG. 8.

FIG. 8 is a schematic cross-sectional view of an image sensor according to example embodiments. FIG. 9 is an enlarged view of third region S3 of FIG. 8. The same elements as described with reference to FIGS. 1 to 7 will not be described again in detail or will only be briefly mentioned.

Referring to FIGS. 8 and 9, an image sensor according to example embodiments may further include a second etch stop layer.

The second etch stop layer 240 may be formed in the first insulation layer 210. The second etch stop layer 240 may be formed in the first insulation layer 210 in the sensor region SENSOR and the first insulation layer 210 in the pad region PAD.

For example, the first insulation layer 210 may include a first layer 210a below the second etch stop layer 240 and a second layer 210b on the second etch stop layer 240. The first layer 210a and the second layer 210b of the first insulation layer 210 may include a same material or different materials.

The second etch stop layer 240 may include a material having an etch selectivity with respect to the first insulation layer 210. For example, the second etch stop layer 240 may include silicon nitride, silicon oxide, silicon carbide, silicon oxynitride, silicon oxycarbide, silicon oxycarbonitride, or combinations thereof. Hereinafter, it will be described that the second etch stop layer 240 includes silicon nitride.

A height of a lower surface of the first lower transparent electrode 410a and a height of a lower surface of the second lower transparent electrode 410b may be the same as a height of a lower surface of the second etch stop layer 240, with respect to the first surface 100a of the substrate 100. For example, referring to FIG. 9, a fourth height H4 from the first surface 100a of the substrate 100 to the lower surface of the first lower transparent electrode 410a may be substantially equal to a fifth height H5 from the first surface 100a of the substrate 100 to the lower surface of the second etch stop layer 240.

In some embodiments, the fourth height H4 may be different from the fifth height H5. For example, according to an etch selectivity of the second etch stop layer 240 with respect to the first insulation layer 210, the fourth height H4 may be smaller or greater than the fifth height H5. For example, according to characteristics of the etch process for forming the first trench T1, the fourth height H4 may be smaller or greater than the fifth height H5.

FIGS. 10 to 17 are views illustration stages in a method of manufacturing an image sensor according to example embodiments. The same elements as described with reference to FIGS. 1 to 7 will not be described again in detail or will only be briefly mentioned.

Figure 10:
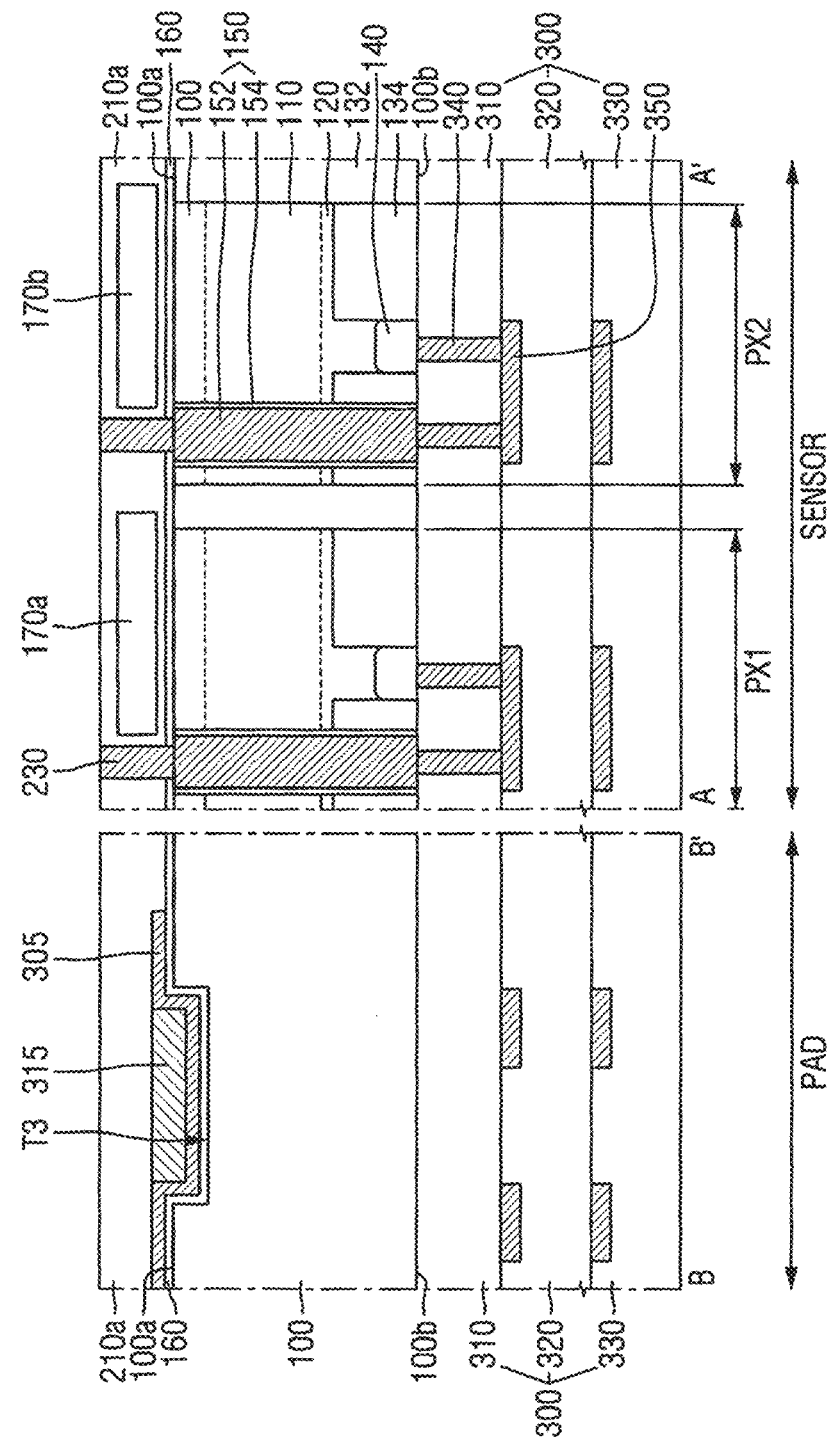
FIGS. 10 to 17 are views illustration stages in a method of manufacturing an image sensor according to example embodiments.

Referring to FIG. 10, the substrate 100 including the sensor region SENSOR and the pad region PAD therein may be provided, and the first layer 210a may be formed on the substrate 100.

For example, first, the through via 150 and the first device isolation layer 132 that pass through the substrate 100, the first photoelectric conversion layer 110 and the well impurity layer 120 that are in the substrate 100, the second device isolation layer 134 adjacent to the second surface 100b of the substrate 100, the storage node region 140 in the well impurity layer 120, the second interlayer insulation structure 300 on the second surface 100b of the substrate 100, and the second contact 340 and the second wiring line 350 that are in the second interlayer insulation structure 300 and are connected to the storage node region 140 may be formed.

Thereafter, the first layer 210a may be formed on the first surface 100a of the substrate 100. The first layer 210a may be formed on the substrate 100 of the sensor region SENSOR and the substrate 100 of the pad region PAD.

The first layer 210a may include an insulating material. For example, the first layer 210a may include low temperature oxide (LTO).

In some example embodiments, the first layer 210a may be formed to cover the first color filter 170a and the second color filter 170b. For example, the first color filter 170a may be formed in the first layer 210a in the first pixel region PX1, and the second color filter 170b may be formed in the first layer 210a in the second pixel region PX2.

In some example embodiments, before the first layer 210a is formed, the antireflection layer 160 may be formed on the first surface 100a of the substrate 100. The antireflection layer 160 may be formed on the substrate 100 of the sensor region SENSOR and the substrate 100 of the pad region PAD.

In some example embodiments, before the first layer 210a is formed, the conductive pad 315 may be formed on the substrate 100 of the pad region PAD. The conductive pad 315 may be formed on the first wiring line 305 formed on the first surface 100a of the substrate 100 (i.e., on the antireflection layer 160) in the pad region PAD. Thus, the first layer 210a may be formed to cover the conductive pad 315.

In some example embodiments, after the first layer 210a is formed, the first contact 230 may be formed. The first contact 230 may pass through the first layer 210a to be connected to the through via 150.

Figure 11:
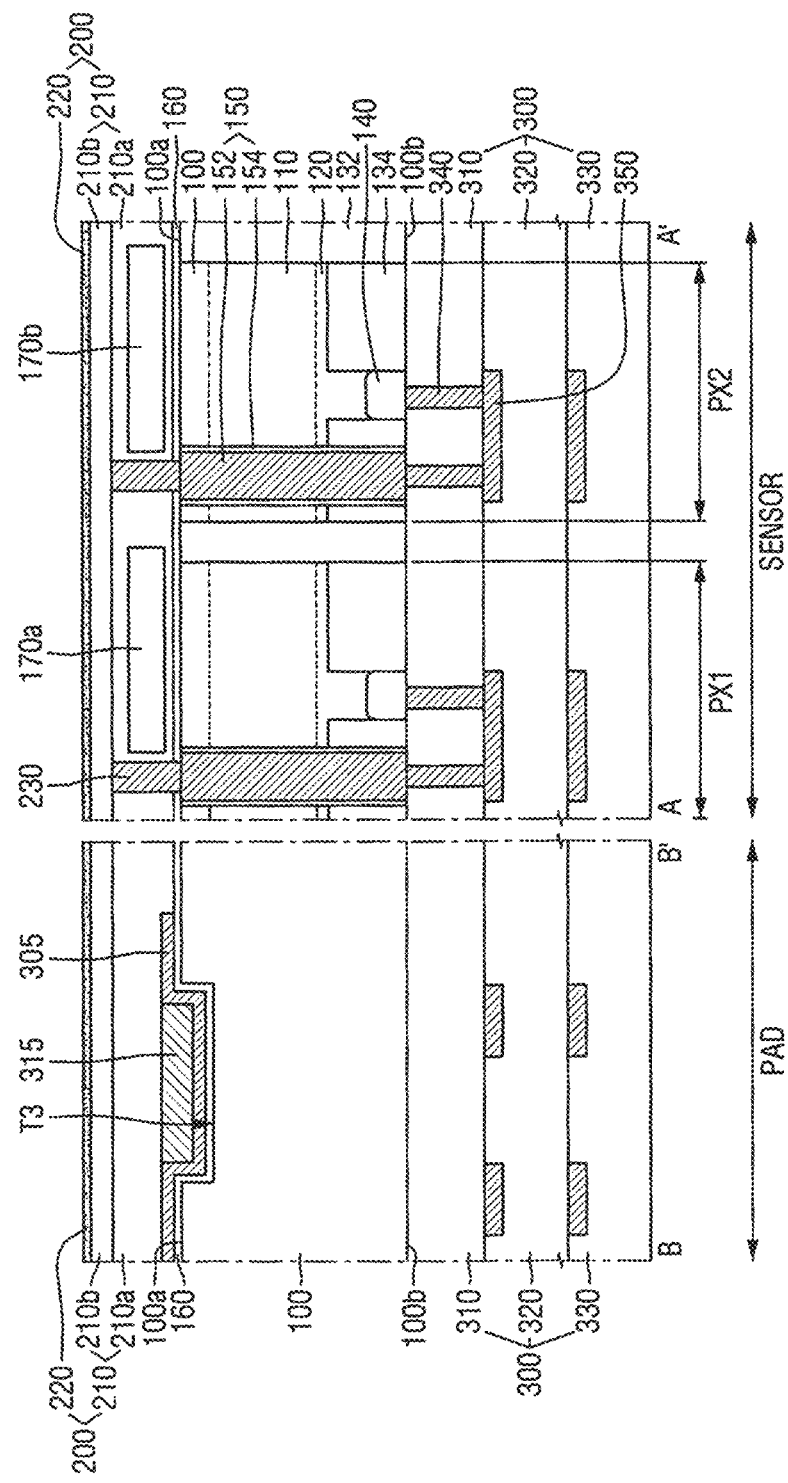

Referring to FIG. 11, the second layer 210b and the first etch stop layer 220 may be sequentially formed on the first layer 210a.

The second layer 210b may be formed on the first layer 210a. The second layer 210b may be formed on the substrate 100 of the sensor region SENSOR and the substrate 100 of the pad region PAD. Thus, the first insulation layer 210 including the first layer 210a and the second layer 210b may be formed on the substrate 100 of the sensor region SENSOR and the substrate 100 of the pad region PAD. In some example embodiments, the first insulation layer 210 may cover the first contact 230.

The second layer 210b may include an insulating material. For example, the second layer 210b may include LTO.

The first etch stop layer 220 may be formed on the first insulation layer 210. The first etch stop layer 220 may be formed on the substrate 100 of the sensor region SENSOR and the substrate 100 of the pad region PAD. Thus, the first interlayer insulation structure 200 including the first insulation layer 210 and the first etch stop layer 220 may be formed on the substrate 100 of the sensor region SENSOR and the substrate 100 of the pad region PAD.

The first etch stop layer 220 may include a material having an etch selectivity with respect to a transparent electrode layer 410 to be formed later. For example, the first etch stop layer 220 may include silicon nitride.

The first etch stop layer 220 may have a sufficient thickness to function as a stopper in the following planarization process. For example, the second thickness D2 of the first etch stop layer 220 may be 30 Å or more. In some example embodiments, the second thickness D2 of the first etch stop layer 220 may range from 300 Å to 700 Å.

Figure 12:
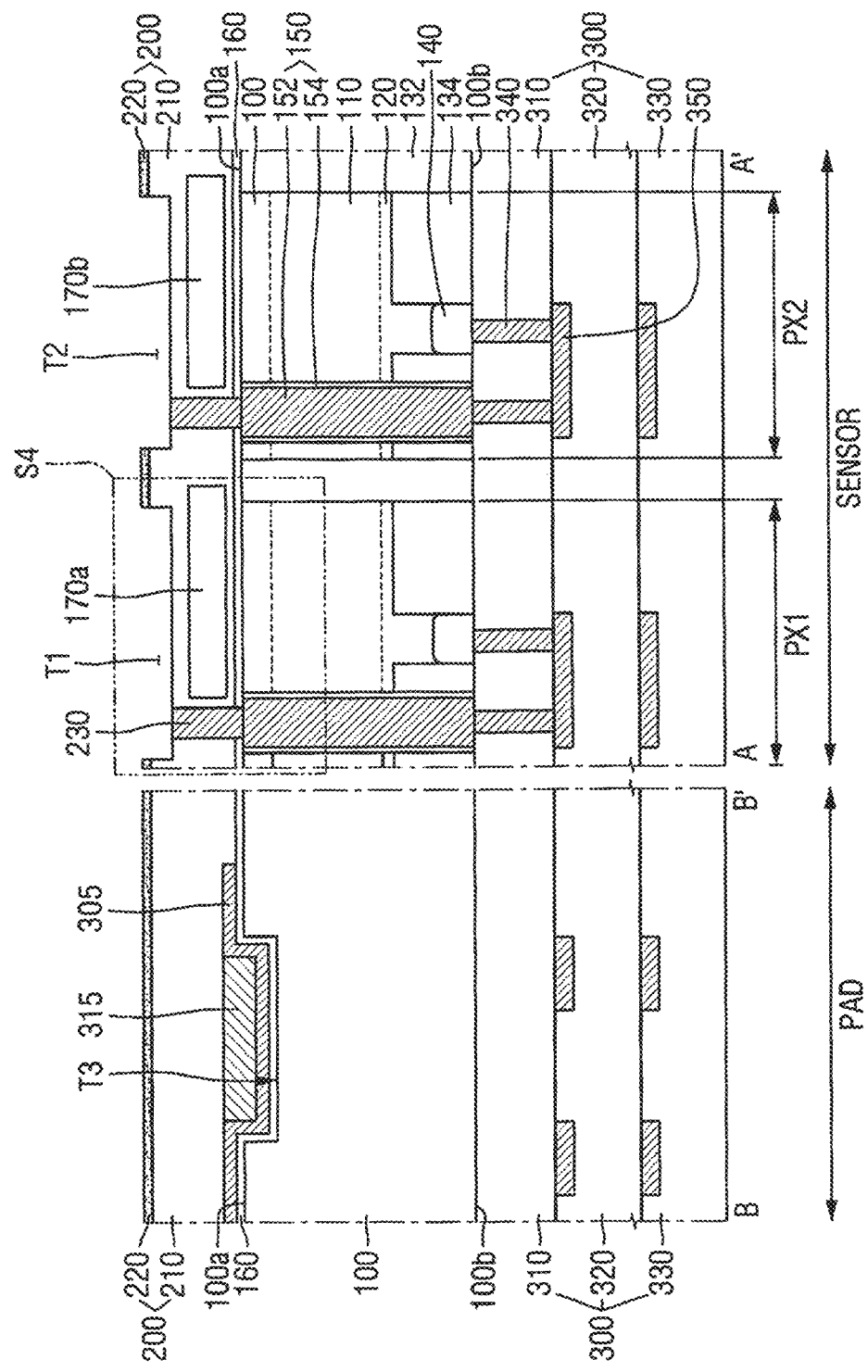
Figure 13:
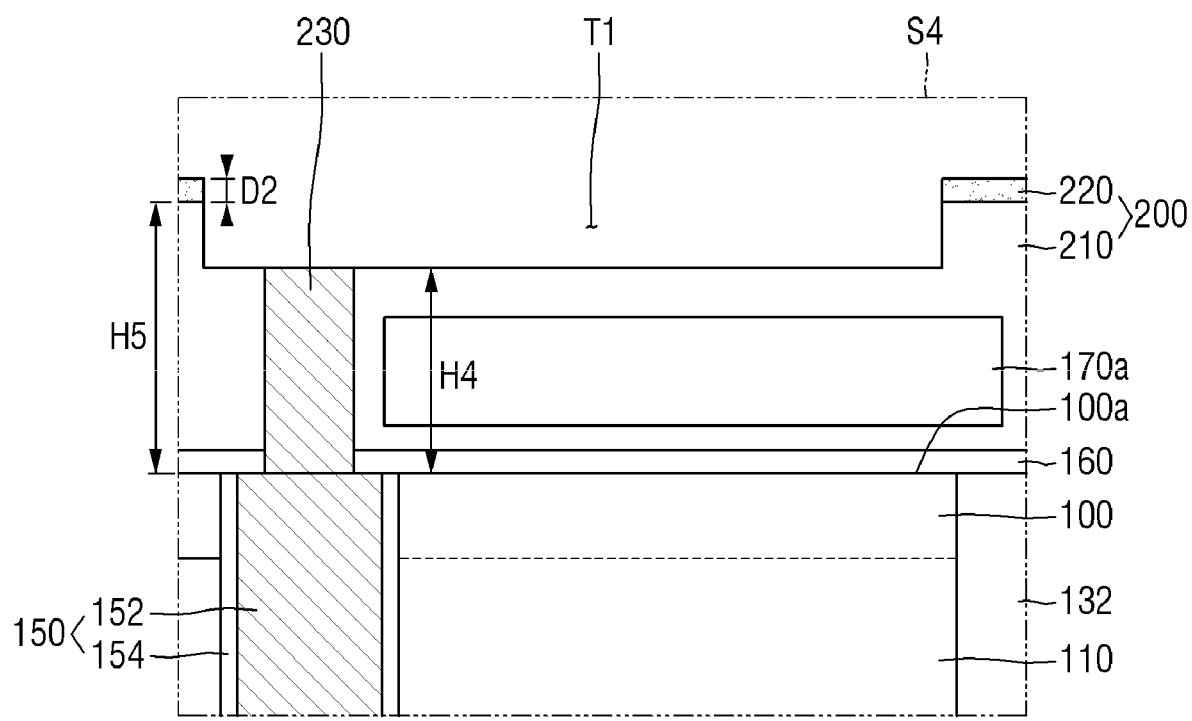

Referring to FIGS. 12 and 13, the first trench T1 and the second trench T2 may be formed in the first interlayer insulation structure 200. FIG. 13 is an enlarged view of fourth region S4 of FIG. 12.

For example, a portion of the first interlayer insulation structure 200 in the first pixel region PX1 may be etched to form the first trench T1, and a portion of the first interlayer insulation structure 200 in the second pixel region PX2 may be etched to form the second trench T2.

In some example embodiments, the etching of the portion of the first interlayer insulation structure 200 may be performed until the first contact 230 is exposed. Thus, the first trench T1 and the second trench T2 exposing the first contact 230 may be formed.

In some example embodiments, a bottom surface of the first trench T1 and a bottom surface of the second trench T2 may be lower than the lower surface of the first etch stop layer 220, with respect to the first surface 100a of the substrate 100. For example, referring to FIG. 13, the fourth height H4 from the first surface 100a of the substrate 100 to the bottom surface of the first trench T1 may be the smaller than the fifth height H5 from the first surface 100a of the substrate 100 to the bottom surface of the first etch stop layer 220. Thus, the first trench T1 and the second trench T2 may pass through the first etch stop layer 220.

Figure 14:
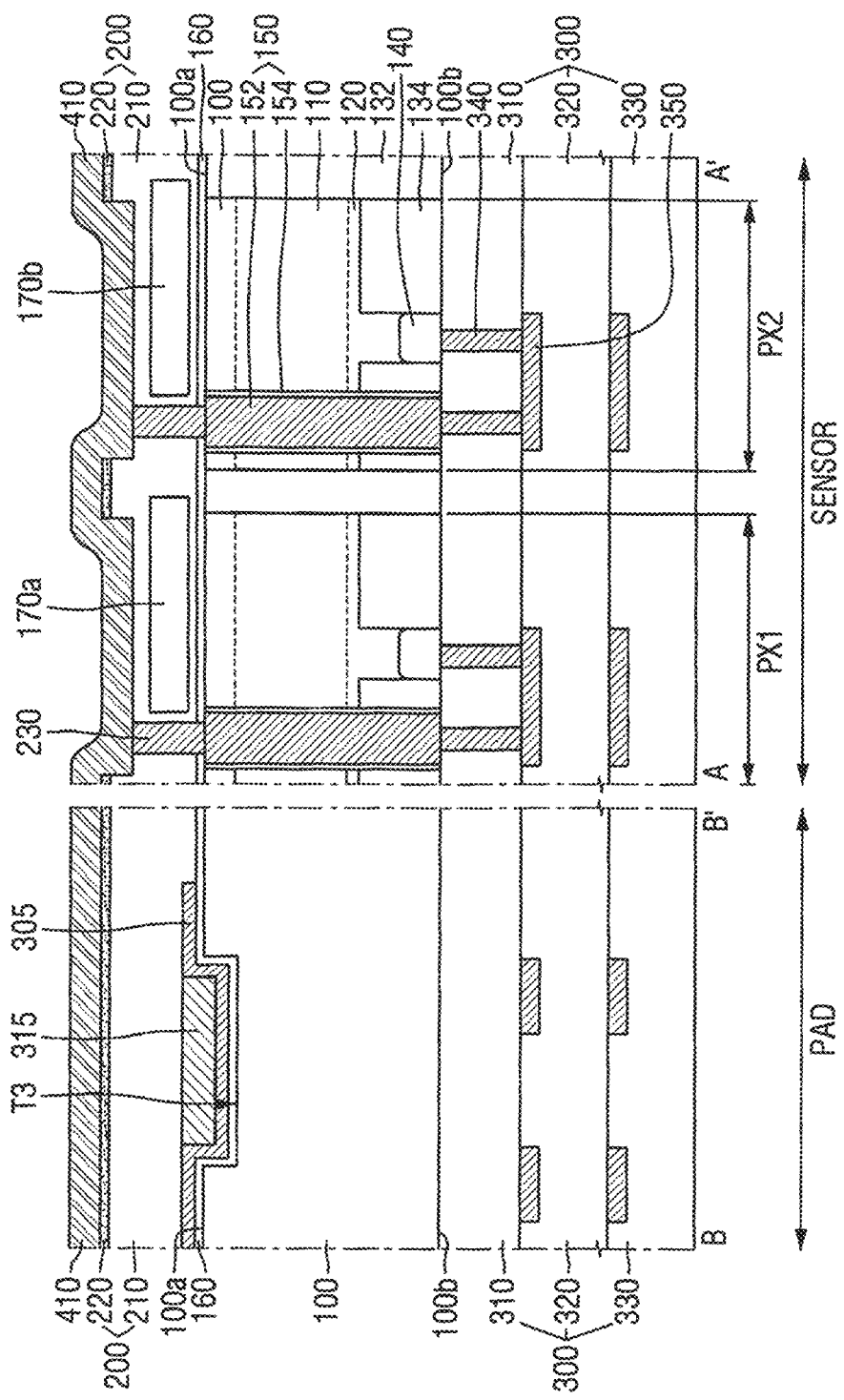

FIG. 14, the transparent electrode layer 410 may be formed on the first interlayer insulation structure 200.

The transparent electrode layer 410 may be formed on the first interlayer insulation structure 200 in the sensor region SENSOR and the first interlayer insulation structure 200 in the pad region PAD.

The transparent electrode layer 410 may be formed to completely fill the first trench T1 and the second trench T2. For example, the transparent electrode layer 410 may be formed on the first interlayer insulation structure 200 so that a lowermost portion of an upper surface of the transparent electrode layer 410 is positioned higher than the upper surface of the first etch stop layer 220, with respect to the first surface 100a of the substrate 100.

The transparent electrode layer 410 may include a material having an etch selectivity with respect to the first etch stop layer 220. The transparent electrode layer 410 may include a transparent conductive material. For example, the transparent electrode layer 410 may include indium tin oxide (ITO).

Figure 15:
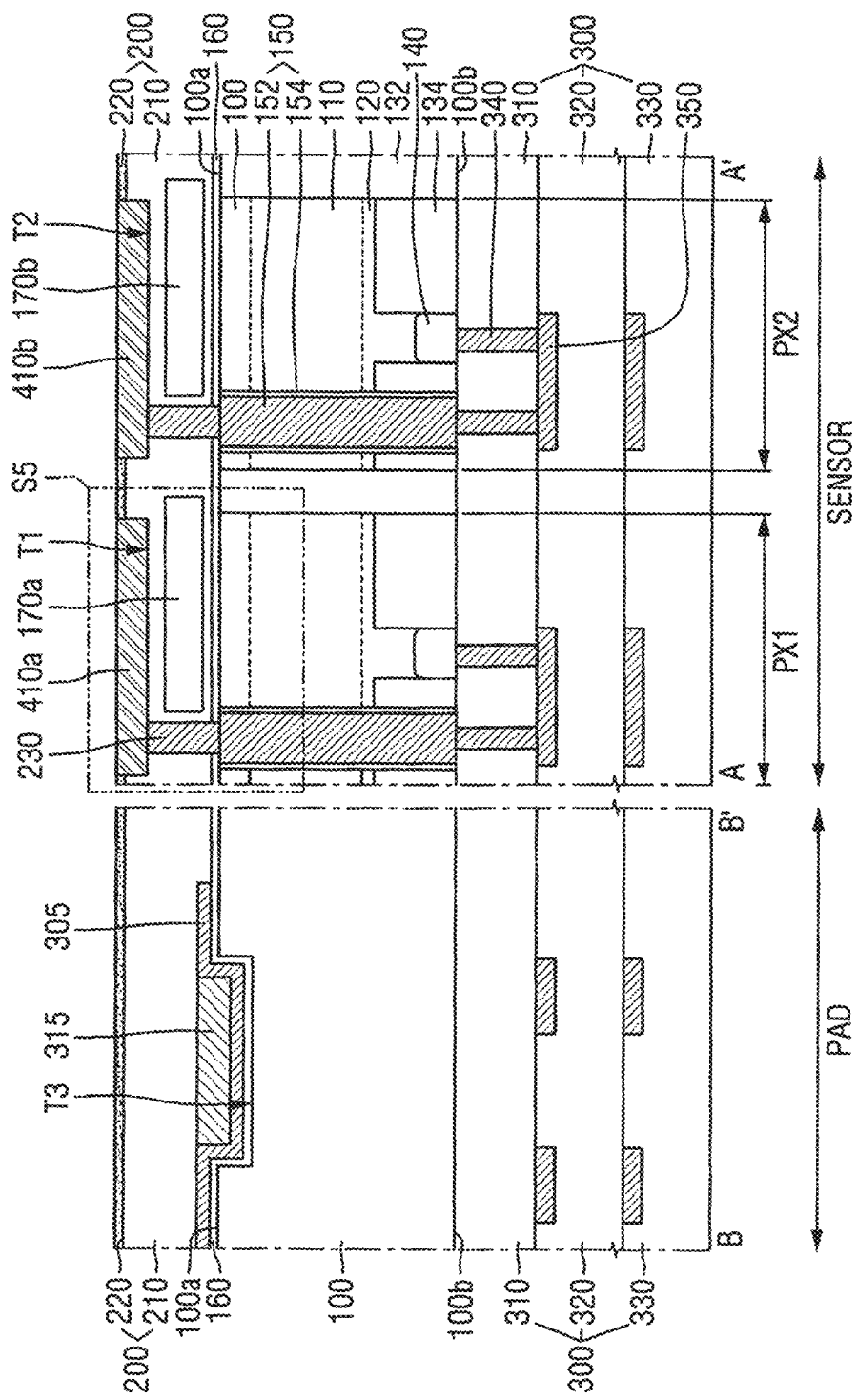
Figure 16:
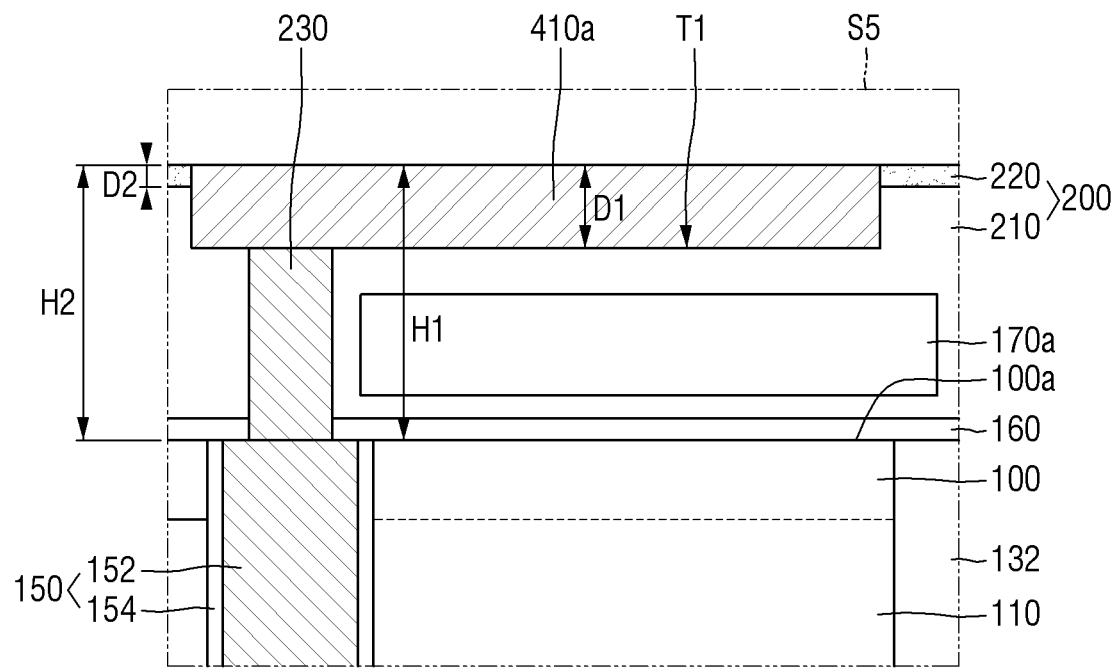
Figure 17:
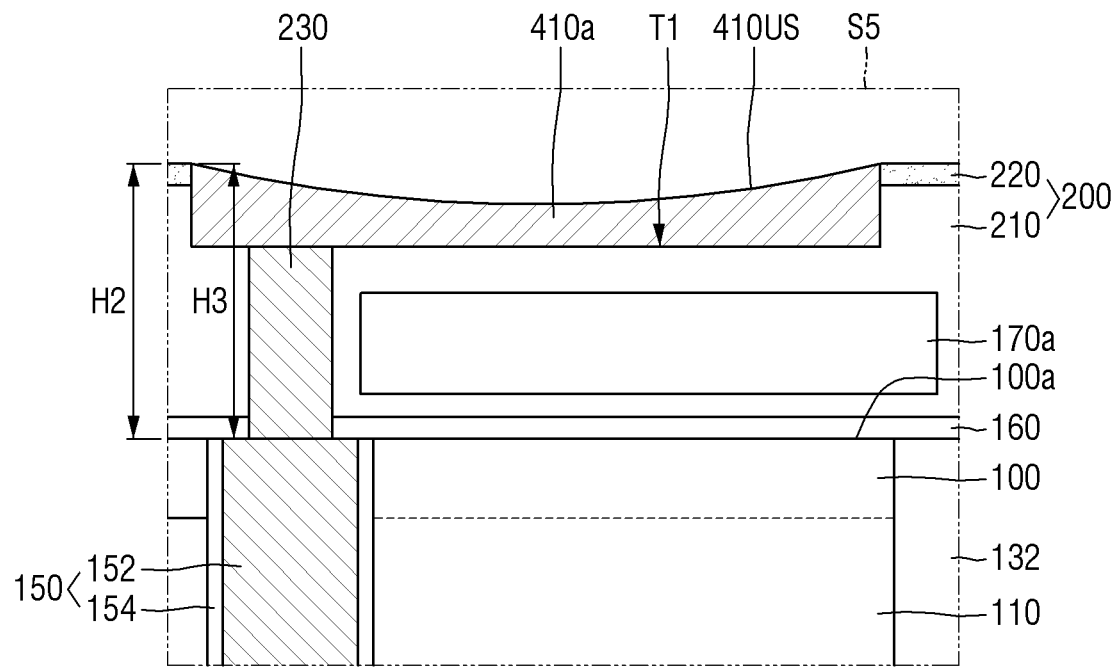

Referring to FIGS. 15 to 17, a planarization process using the first etch stop layer 220 as a stopper may be performed. FIGS. 16 and 17 are enlarged views of fifth region S5 of FIG. 15.

For example, the planarization process may be performed on the transparent electrode layer 410 until the first etch stop layer 220 is exposed, such that the first lower transparent electrode 410a filling the first trench T1 and the second lower transparent electrode 410b filling the second trench T2 may be formed.

Thus, a height of an upper surface of the first lower transparent electrode 410a and a height of an upper surface of the second lower transparent electrode 410b may be substantially equal to a height of the upper surface of the first etch stop layer 220, with respect to the first surface 100a of the substrate 100. For example, referring to FIG. 16, the height H1 of the upper surface of the first lower transparent electrode 410a may be substantially equal to the second height H2 of the upper surface of the first etch stop layer 220.

The planarization process may include, e.g., a chemical mechanical polishing (CMP) process. In some example embodiments, an etch selectivity of the transparent electrode layer 410 with respect to the first etch stop layer 220 may be 20 or more. Thus, the first etch stop layer 220 may be hardly etched during the formation of the first lower transparent electrode 410a and the second lower transparent electrode 410b.

The CMP process may be performed using a slurry having different removal rates with respect to the first etch stop layer 220 and the transparent electrode layer 410. The slurry may include ceria, silica, alumina, or the like, but is not limited thereto.

The CMP process may be performed in the environment of pH 1 to pH 5.

In some example embodiments, a thickness of the first lower transparent electrode 410a and a thickness of the second lower transparent electrode 410b may be greater than a thickness of the first etch stop layer 220. For example, referring to FIG. 16, the first thickness D1 of the first lower transparent electrode 410a may be greater than the second thickness D2 of the first etch stop layer 220.

In some example embodiments, after the planarization process is performed, the second thickness D2 of the first etch stop layer 220 may range from 200 Å to 600 Å.

In some example embodiments, the upper surface of the first lower transparent electrode 410a and the upper surface of the second lower transparent electrode 410b may be concave. For example, referring to FIG. 17, the upper surface 410US of the first lower transparent electrode 410a may have an upward concave shape (or a downward convex shape). For example, the upper surface 410US of the first lower transparent electrode 410a may be concave by a dishing phenomenon generated during the planarization process.

In some example embodiments, a height of the uppermost surface of the first lower transparent electrode 410a and a height of the uppermost surface of the second lower transparent electrode 410b may be substantially equal to the height of the upper surface of the first etch stop layer 220, with respect to the first surface 100a of the substrate 100. For example, referring to FIG. 17, the third height H3 of the uppermost surface of the first lower transparent electrode 410a may be substantially equal to the second height H2 of the upper surface of the first etch stop layer 220, with respect to the first surface 100a of the substrate 100.

Referring again to FIG. 5, the second photoelectric conversion layer 420, the upper transparent electrode 430, and the microlens 440 may be formed on the first lower transparent electrode 410a and the second lower transparent electrode 410b.

The second photoelectric conversion layer 420 may be formed to extend along the upper surface of the first lower transparent electrode 410a, and the upper surface of the second lower transparent electrode 410b, and the upper surface of the first etch stop layer 220 in the sensor region SENSOR. The second photoelectric conversion layer 420 may include, e.g., an organic photo diode.

The upper transparent electrode 430 may be formed on the second photoelectric conversion layer 420. The upper transparent electrode 430 may include, e.g., ITO.

The microlens 440 may be formed on the upper transparent electrode 430. The microlens 440 may include an organic material, e.g., light-transmitting resin.

To form a transparent electrode in a trench formed in the sensor region, a transparent electrode layer may be formed to fill the trench, and then a planarization process may be performed. However, since the transparent electrode layer fills the trench formed in only the sensor region, a step may be formed between the sensor region and the pad region. In the subsequent planarization process to form lower transparent electrodes, a residue of the transparent electrode layer may be left in the pad region due to the step.

To reduce (or, alternatively, prevent) the above problem, the transparent electrode layer in the pad region may be removed first by a photolithography process. However, this method may increase process steps, and thus, the productivity of the image sensor may be lowered.

In contrast, in the image sensor and the method of manufacturing the same according to example embodiments, a step between the sensor region SENSOR and the pad region PAD may be reduced or removed using the first etch stop layer 220 as a stopper in the planarization process on the transparent electrode layer 410. Thus, the process for manufacturing the image sensor may be simplified, such that the productivity of the image sensor may be increased.

Figure 18:
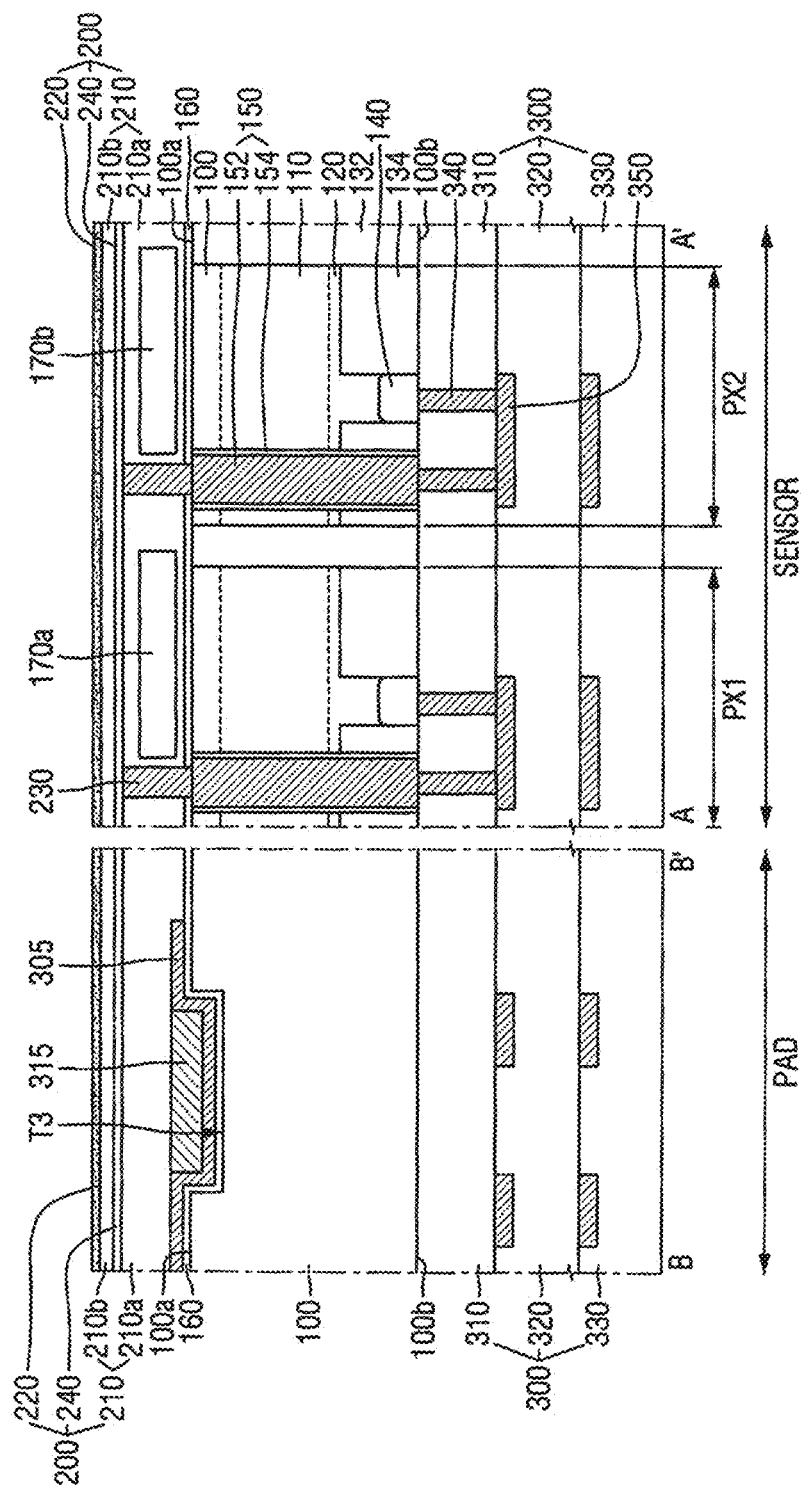
FIGS. 18 to 20 are views illustration stages in a method of manufacturing an image sensor according to example embodiments.
Figure 19:
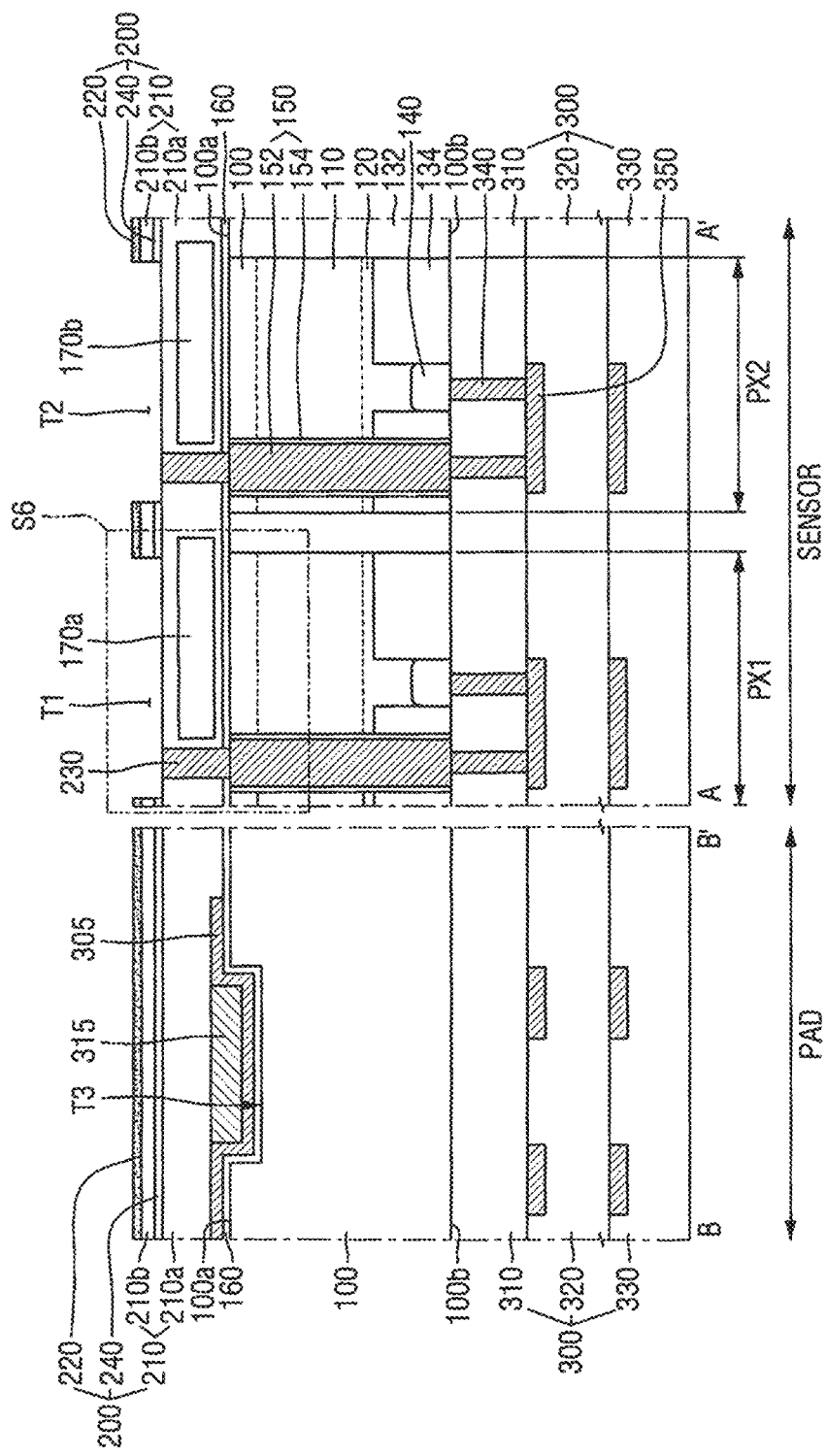
Figure 20:
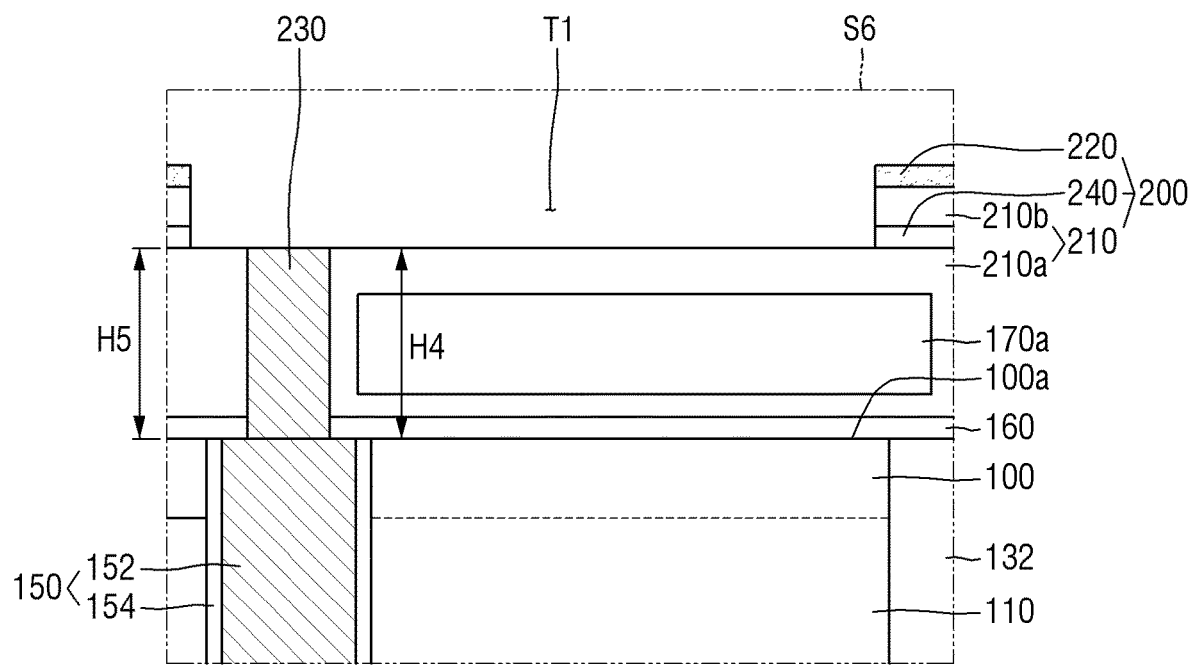

FIGS. 18 to 20 are views illustration stages in a method of manufacturing an image sensor according to example embodiments. The same elements as described with reference to FIGS. 1 to 17 will not be described again in detail or will only be briefly mentioned.

FIG. 18 illustrates a process stage after the process stage shown in FIG. 10.

Referring to FIG. 18, the second etch stop layer 240, the second layer 210b and the first etch stop layer 220 may sequentially formed on the first layer 210a.

The second etch stop layer 240 may be formed on the first layer 210a. The second etch stop layer 240 may be formed on the substrate 100 of the sensor region SENSOR and the substrate 100 of the pad region PAD. In some embodiments, the second etch stop layer 240 may cover the first contact 230.

Thus, the first insulation layer 210 may include the first layer 210a below the second etch stop layer 240 and the second layer 210b on the second etch stop layer 240. The first interlayer insulation structure 200 including the first insulation layer 210, the first etch stop layer 220, and the second etch stop layer 240 may be formed on the substrate 100 of the sensor region SENSOR and the substrate 100 of the pad region PAD.

The second etch stop layer 240 may include a material having an etch selectivity with respect to the first insulation layer 210. For example, the second etch stop layer 240 may include silicon nitride.

Referring to FIGS. 19 and 20, the first trench T1 and the second trench T2 may be formed in the first interlayer insulation structure 200 in the sensor region SENSOR. FIG. 20 is an enlarged view of sixth region S6 of FIG. 19.

For example, a portion of the first interlayer insulation structure 200 may be etched by an etch process using the second etch stop layer 240 as a stopper to form the first trench T1 and the second trench T2.

A height of a bottom surface of the first trench T1 and a height of a bottom surface of the second trench T2 may be equal to a height of a lower surface of the second etch stop layer 240, with respect to the first surface 100a of the substrate 100. For example, referring to FIG. 19, the fourth height H4 of the bottom surface of the first trench T1 may be substantially equal to the fifth height H5 of the lower surface of the second etch stop layer 240, with respect to the first surface 100a of the substrate 100.

In some embodiments, the fourth height H4 may be different from the fifth height H5. For example, according to an etch selectivity of the second etch stop layer 240 with respect to the first insulation layer 210, the fourth height H4 may be smaller or greater than the fifth height H5. In addition, according to characteristics of the etch process for forming the first trench T1, the fourth height H4 may be smaller or greater than the fifth height H5.

While example embodiments of the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. An image sensor comprising:
   a substrate including a sensor region and a pad region adjacent to the sensor region;
   an insulation layer on the substrate;
   a lower transparent electrode on the insulation layer within the sensor region; and
   an etch stop layer on the insulation layer within both the sensor region and the pad region, wherein
   a height of an uppermost portion of an upper surface of the lower transparent electrode with respect to the substrate is substantially equal to a height of an upper surface of the etch stop layer with respect to the substrate.

2. The image sensor according to claim 1, wherein a height of portion of the upper surface of the lower transparent electrode adjacent to the etch stop layer is substantially equal to the height of the upper surface of the etch stop layer with respect to the substrate.

3. The image sensor according to claim 1, wherein a thickness of the lower transparent electrode is greater than a thickness of the etch stop layer.

4. The image sensor according to claim 1, wherein the etch stop layer contacts a sidewall of the lower transparent electrode.

5. The image sensor according to claim 1, wherein the insulation layer includes a low temperature oxide (LTO).

6. The image sensor according to claim 1, wherein the lower transparent electrode includes indium tin oxide (ITO).

7. The image sensor according to claim 1, further comprising:
   a photoelectric conversion layer on the lower transparent electrode;
   an upper transparent electrode on the photoelectric conversion layer; and
   a microlens on the upper transparent electrode.

8. The image sensor according to claim 1, further comprising:
   a color filter in the insulation layer below the lower transparent electrode.

9. An image sensor comprising:
   a substrate including a sensor region and a pad region, the sensor region including a first pixel region a second pixel region;
   an insulation layer on the substrate;
   a first lower transparent electrode on the insulation layer within the first pixel region;
   a second lower transparent electrode on the insulation layer within the second pixel region; and
   a first etch stop layer on the insulation layer in the sensor region and the pad region such that, in the sensor region, the first etch stop layer is on the insulation layer between the first lower transparent electrode and the second lower transparent electrode, wherein
   an uppermost portion of an upper surface of the first lower transparent electrode with respect to the substrate is substantially coplanar with an upper surface of the first etch stop layer with respect to the substrate.

10. The image sensor according to claim 9, wherein the first etch stop layer includes silicon nitride.

11. The image sensor according to claim 9, further comprising:
    a first color filter in the insulation layer below the first lower transparent electrode; and
    a second color filter in the insulation layer below the second lower transparent electrode, wherein
    the second color filter adsorbs light of a wavelength different from that of the light adsorbed in the first color filter.

12. The image sensor according to claim 9, wherein the insulation layer includes silicon oxide.

13. The image sensor according to claim 12, further comprising:
    a second etch stop layer in the insulation layer, the second etch stop layer including silicon nitride, wherein
    the insulation layer includes a first layer below the second etch stop layer with respect to the substrate and a second layer on the second etch stop layer.

14. An image sensor comprising:
    a substrate including a sensor region and a pad region adjacent to the sensor region;
    a first photoelectric conversion layer in a portion of the substrate associated with the sensor region;
    an interlayer insulation structure on the substrate, the interlayer insulation structure including an insulation layer and an etch stop layer on the insulation layer;
    a trench in a portion of the interlayer insulation structure associated with the sensor region;
    a lower transparent electrode in the trench; and
    a second photoelectric conversion layer on the lower transparent electrode.

15. The image sensor according to claim 14, wherein an upper surface of the lower transparent electrode with respect to the substrate is higher than a lower surface of the etch stop layer with respect to the substrate.

16. The image sensor according to claim 14, wherein an upper surface of the lower transparent electrode is concave.

17. The image sensor according to claim 14, wherein the second photoelectric conversion layer includes an organic photo diode.

18. The image sensor according to claim 14, further comprising:
    a color filter in the insulation layer below the lower transparent electrode.

19. The image sensor according to claim 18, wherein the trench is in the interlayer insulation structure on the color filter.

20. The image sensor according to claim 14, further comprising:
    a through via passing through the substrate and electrically connected to the lower transparent electrode.

* * * * *